(12) United States Patent
Mitani et al.

(10) Patent No.: US 6,392,277 B1
(45) Date of Patent: May 21, 2002

(54) SEMICONDUCTOR DEVICE

(75) Inventors: Shinichiro Mitani; Takahide Ikeda, both of Tokorozawa; Kazutaka Mori, Kodaira; Hisayuki Higuchi, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/554,754

(22) PCT Filed: Sep. 21, 1998

(86) PCT No.: PCT/JP98/04256

§ 371 Date: May 19, 2000

§ 102(e) Date: May 19, 2000

(87) PCT Pub. No.: WO99/27585

PCT Pub. Date: Jun. 3, 1999

(30) Foreign Application Priority Data

Nov. 21, 1997 (JP) ............................................. 9-320973

(51) Int. Cl.[7] .......................... H01L 27/01; H01L 27/12; H01L 31/0392
(52) U.S. Cl. ......................................... 257/347; 257/350
(58) Field of Search ........................... 257/59, 159, 205, 257/219, 226, 228, 347, 348, 349, 350, 351, 352, 407

(56) References Cited

U.S. PATENT DOCUMENTS 6,043,536 A * 3/2000 Numata et al. ............. 257/347
6,063,686 A * 5/2000 Masuda et al. ............. 438/406

FOREIGN PATENT DOCUMENTS

JP         7-131025        5/1995

* cited by examiner

Primary Examiner—David Nelms
Assistant Examiner—David Nhu
(74) Attorney, Agent, or Firm—Antonelli, Terry, Stout & Kraus, LLP

(57) ABSTRACT

A semiconductor device having a field effect transistor formed in a semiconductor layer provided on an insulating layer is provided with a body electrode electrically connected to a channel forming region of the field effect transistor, and a back gate electrode provided below the insulating layer so as to be opposed to the channel forming region of the field effect transistor. A potential for controlling carriers of conduction type opposite to a channel formed in an upper portion of the channel forming region of the field effect transistor is applied to each of the body electrode and the back gate electrode. Thus, the withstand voltage for the drain of the field effect transistor can be increased. It is also possible to stabilize the threshold voltage of the field effect transistor. Furthermore, the threshold voltage of the field effect transistor can be changed in a stable state.

25 Claims, 22 Drawing Sheets

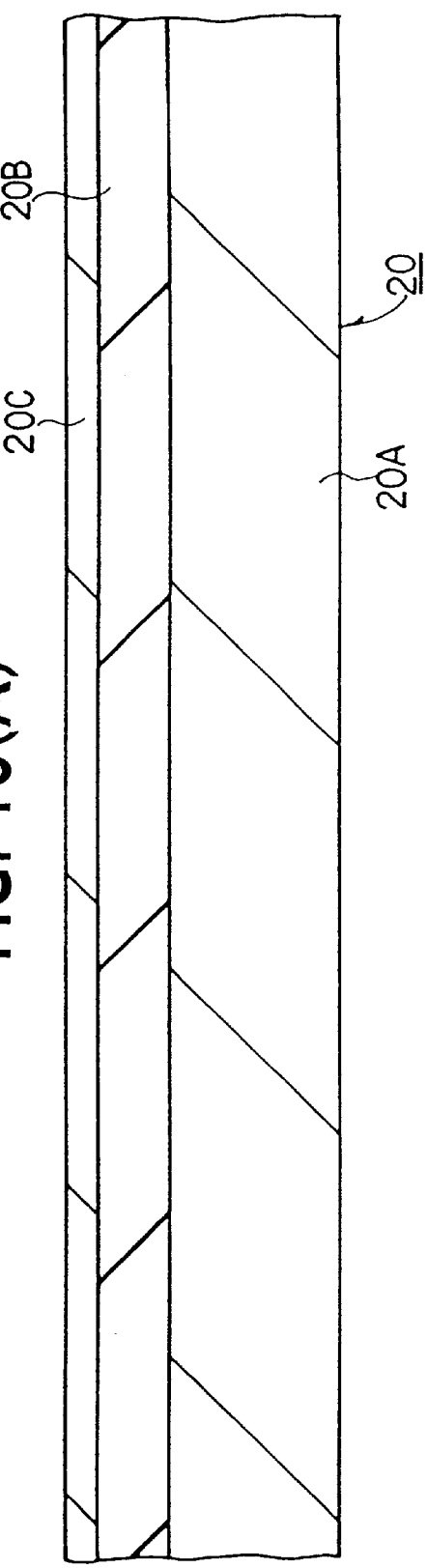
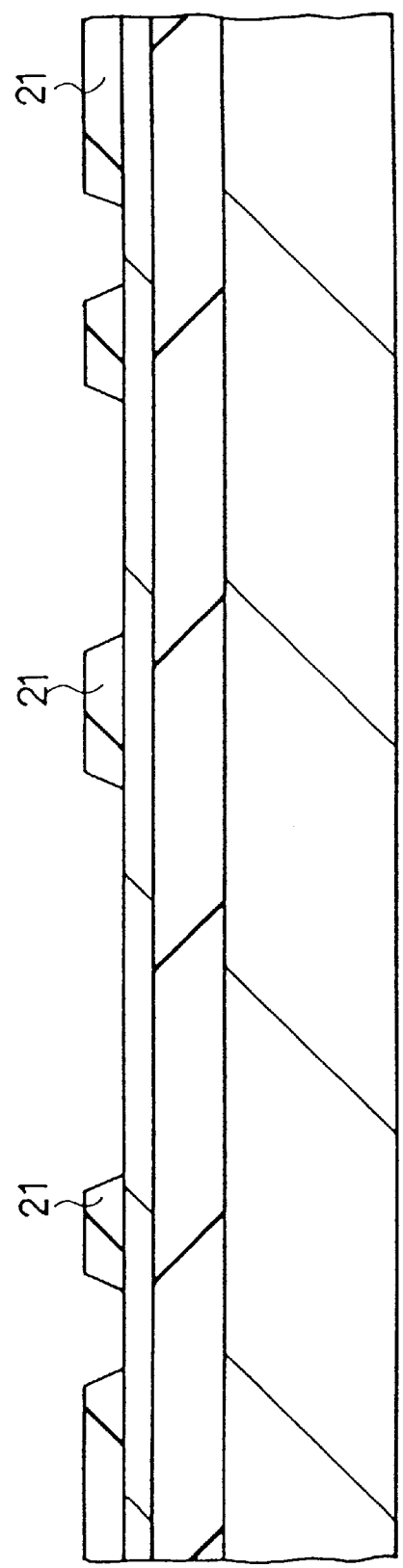
FIG. 10(A)
FIG. 10(B)

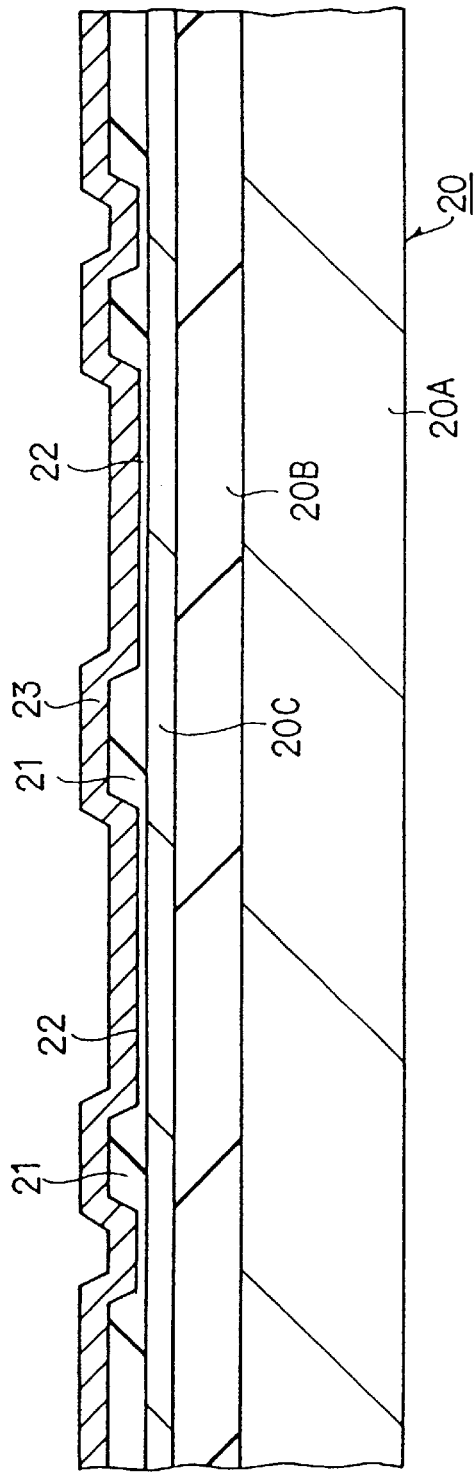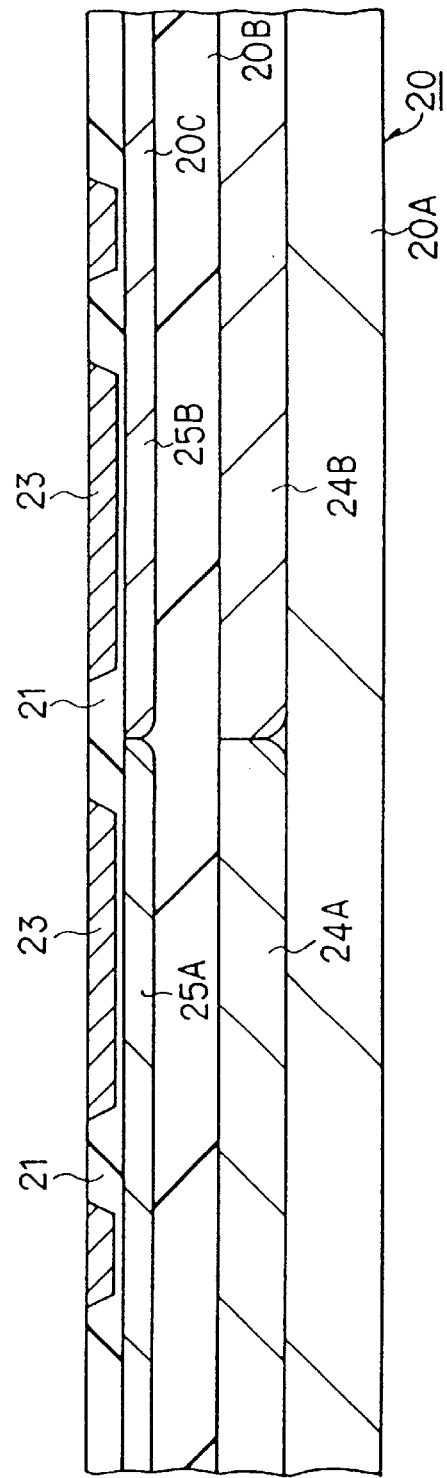

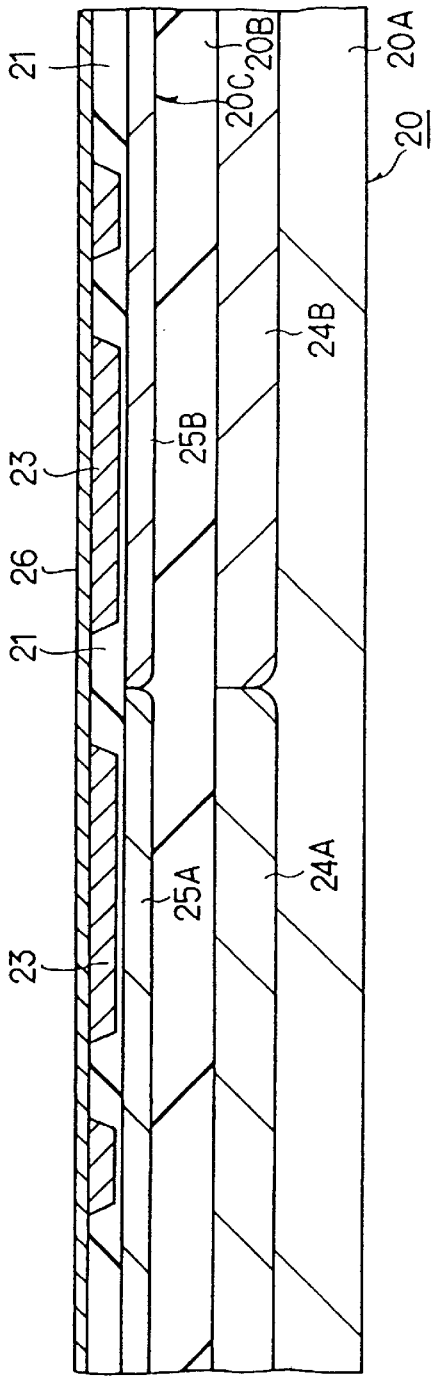
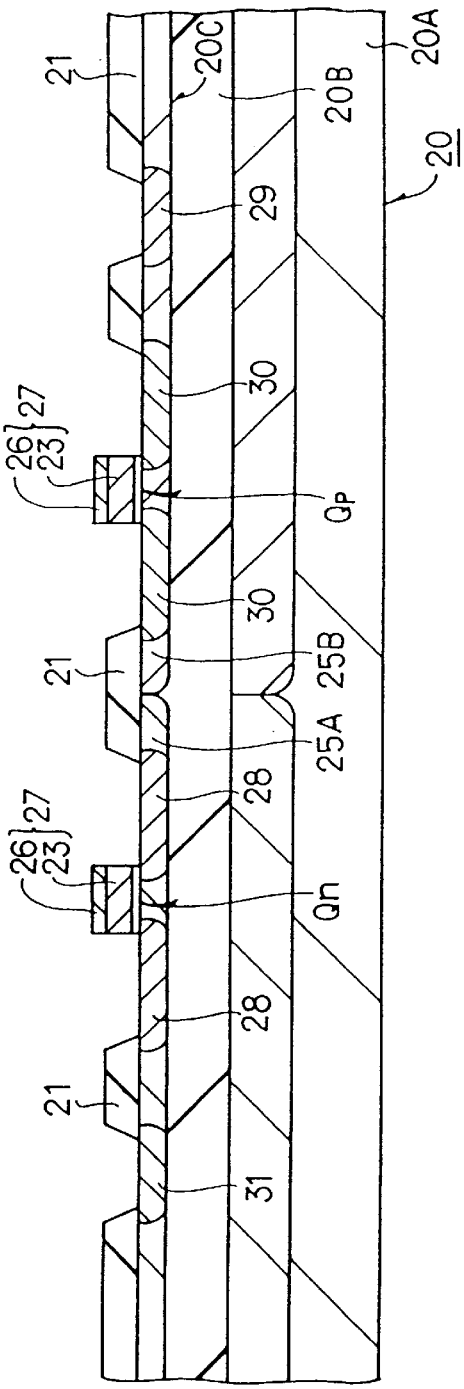
FIG. 10(E)
FIG. 10(F)

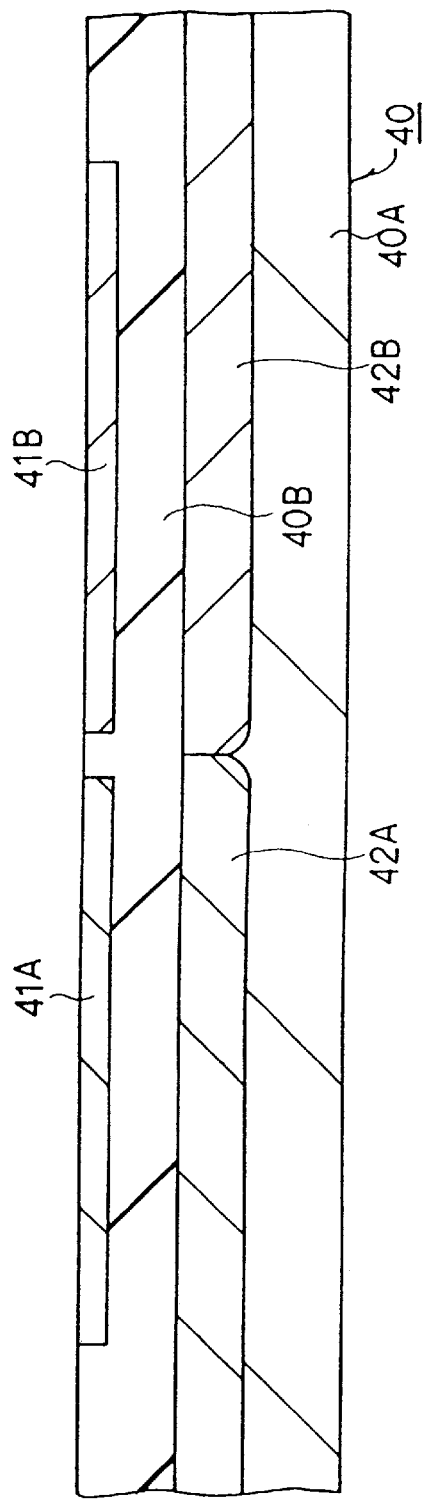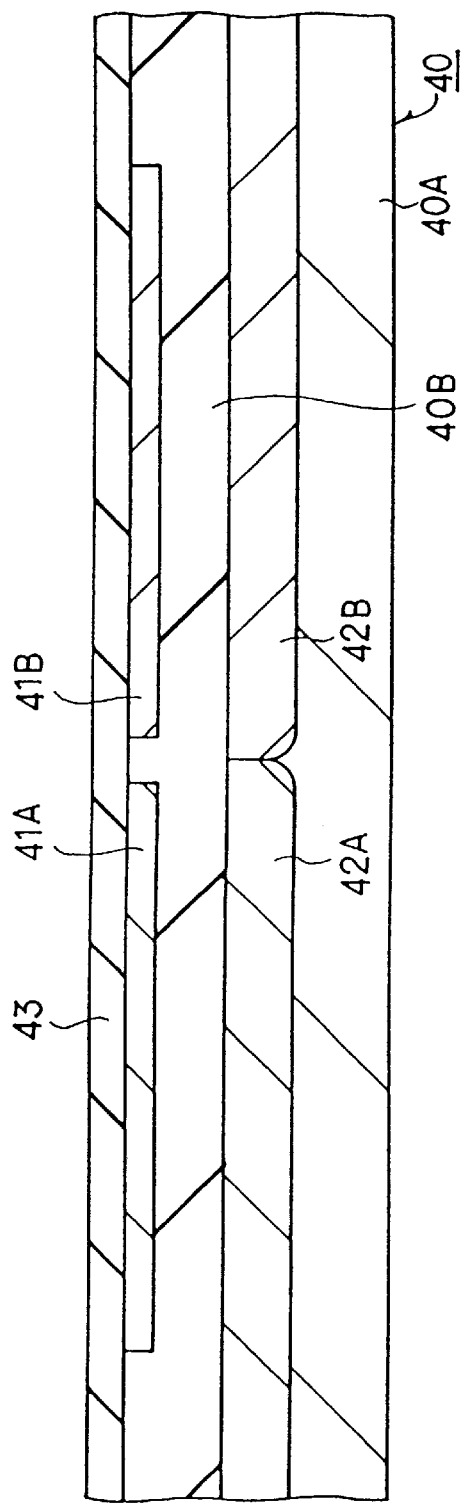

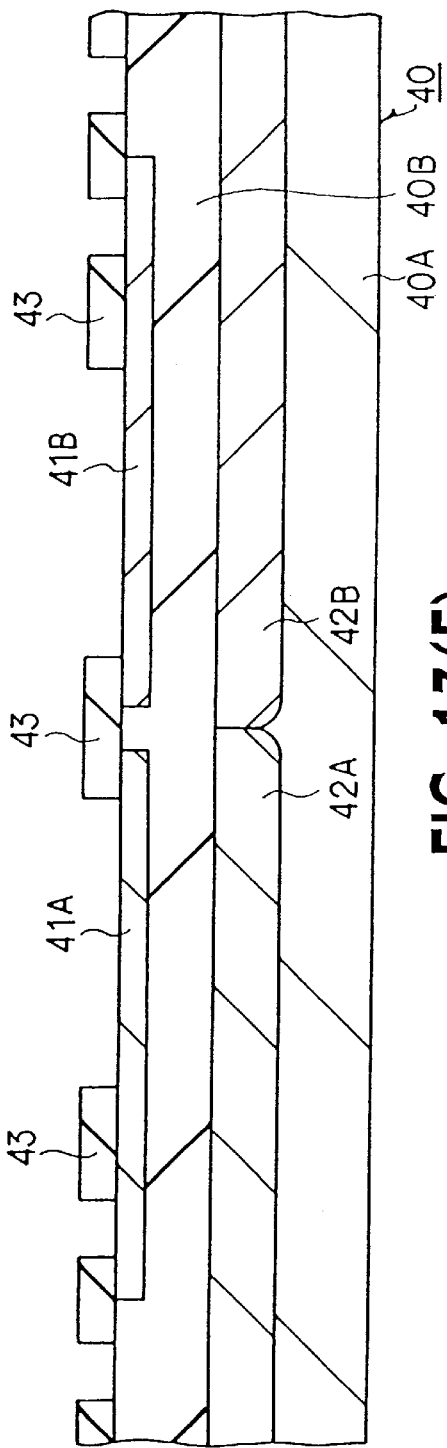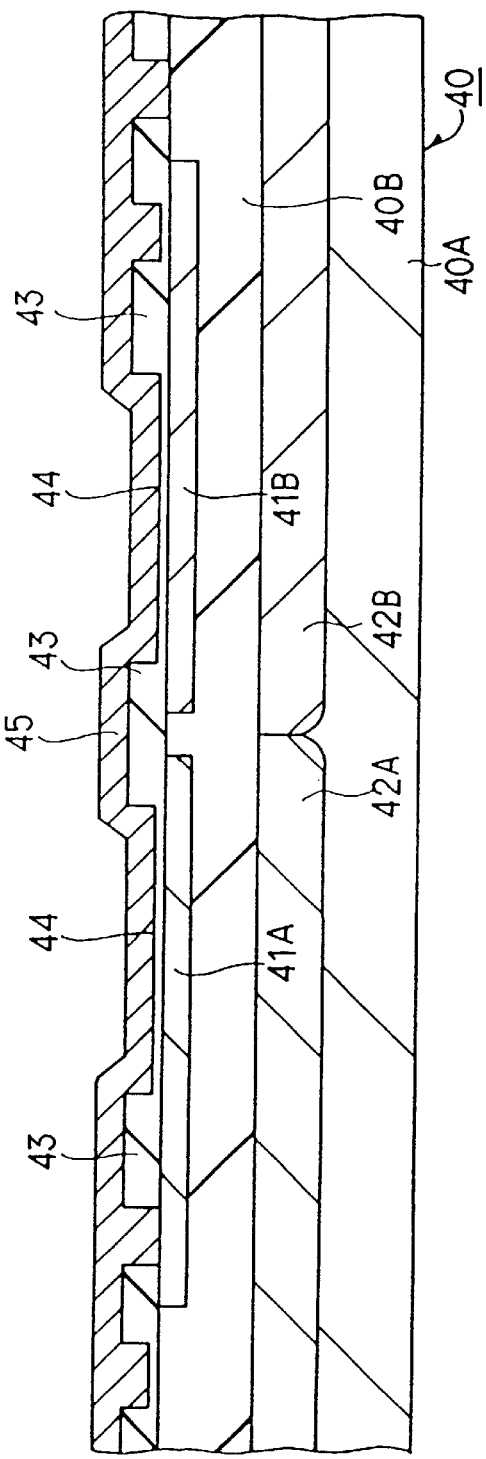

(1) NORMAL OPERATION MODE (2) MASS DATA NUMERICAL CALCULATION MODE
(VECTOR COMPUTE MODE)

SEMICONDUCTOR DEVICE

FIELD OF THE INVENTION

The present invention relates to a semiconductor device, and, more particularly, to a technique which is effective for application to a semiconductor device having a field effect transistor formed in a semiconductor layer provided on an insulating layer.

DESCRIPTION OF THE RELATED ART

An attempt has been made to use a semiconductor base having a so-called SOI (Silicon On Insulator) structure provided with an insulating layer composed of silicon oxide between a semiconductor substrate composed of monocrystal silicon and a thin semiconductor layer composed of monocrystal silicon and to form a field effect transistor in a semiconductor layer of the semiconductor base in a semiconductor device, such as a field effect transistor. The field effect transistor has a channel forming region (body region), a gate insulator, a gate electrode and a pair of semiconductor regions corresponding to source and drain regions and has a structure wherein the bottoms of the pair of semiconductor regions corresponding to the source and drain regions are brought into an insulating layer of a semiconductor base. Since the field effect transistor can reduce pn junction capacities (parasitic capacities) added to the source and drain regions by portions equivalent to contact areas of the respective bottoms of the pair of semiconductor regions, a fast switching speed can be achieved.

On the other hand, since the periphery of the channel forming region is surrounded by a pair of semiconductor regions and the insulating layer of the semiconductor base, the above-described field effect transistor has a reduced threshold voltage (Vth) as compared with the case in which a field effect transistor is formed in a semiconductor base comprised of a normal bulk substrate. Therefore, a method of providing a feeding contact region (body electrode) electrically connected to a channel forming region within a semiconductor layer of a semiconductor base and applying a potential to the feeding contact region to thereby vary the threshold voltage has been proposed for a partial depletion type field effect transistor, in which a channel forming region is not completely depleted, but some remains as a neutral region. This method has been disclosed in, for example, 1997 IEEE International Solid-State Circuit Conference, Digest of Technical Papers, 6869 TP 4.3 [A 1V 46 ns 16 Mb SOI-DRAM with Body Control Technique].

Further, a method of providing a back gate electrode below an insulating layer of a semiconductor base, as opposed to a channel forming region, and applying a potential to the back gate electrode to thereby change the threshold voltage has been proposed for a complete depletion type field effect transistor wherein the channel forming region is completely depleted. This method has been disclosed in Japanese Patent Application Laid-open No. Hei 7-131025.

However, the present inventors have found the following problems as a result of discussions about the aforementioned technique.

(1) When the partial depletion type field effect transistor is of, for example, an n channel conduction type, a p type channel forming region produces a depleted region due to a gate electric field and potentials applied to its source and drain, and some of this region serves as a neutral region. When a VGS potential is applied to a gate-electrode, a VS potential (=0[V]) is applied to one semiconductor region, a VDS potential ($\geq$VS potential) is applied to the other semiconductor region, and a VSub potential ($\leq$0[V]) is applied to a feeding contact region, a channel current flows so that electrons and holes are developed in a high field region near the drain. The electrons flow into a drain region which is higher in potential, whereas the holes flow into a neutral region which is low in potential. The holes are drawn or drained to the feeding contact region through the neutral region. Since, however, the resistance of the neutral region is high, the neutral region becomes high in potential. Since the electrons flow from the source to a channel according to a bipolar operation when the neutral region is high in potential, the occurrence of the holes increases in the high field region near the drain. A problem arises in that, since the potential of the neutral region increases more and more due to the circulation of these series of mechanisms, the withstand voltage for the drain becomes low. A further problem arises in that the threshold voltage becomes unstable. These problems arise similarly even in the case of a p channel conduction type.

(2) When the complete depletion type field effect transistor is of, for example, an n channel conduction type, each channel forming region is completely depleted. Therefore, there is no escape route for holes produced in a high field region near its drain. Therefore, a problem arises in that, since all of the generated holes flow into a source region, the withstand voltage for the drain becomes low due to a bipolar operation. A further problem arises in that, since the channel forming region is completely depleted, the threshold voltage cannot be increased. A method of changing the threshold of a complete depletion type field effect transistor by a back gate bias has been disclosed in Japanese Patent Application Laid-open No. Hei 1(1989)-115394. Since, however, the potential of a lower portion (lower surface portion) of a channel forming region is lowered by a minus back gate potential, as indicated by its detailed discussions, holes generated in the vicinity of the drain are stored in a lower portion of a channel forming region and hence the threshold voltage becomes unstable. These problems arise similarly even in the case of a p channel conduction type.

(3) The partial depletion type field effect transistor and the complete depletion type field effect transistor are respectively low in threshold voltage and also low in drain withstand voltage as described above. Thus, since the threshold voltage cannot be changed in a stable state, a standby current becomes large and hence a standby current test cannot be carried out. Further, since the withstand voltage for the drain is low, high-voltage aging cannot be performed.

An object of the present invention is to provide a technique which is capable of increasing the withstand voltage for a drain of a field effect transistor formed in a semiconductor layer provided on an insulating layer.

Another object of the present invention is to provide a technique which is capable of achieving a stabilization of a threshold voltage of a field effect transistor formed in a semiconductor layer provided on an insulating layer.

A further object of the present invention is to provide a technique which is capable of changing a threshold voltage of a field effect transistor formed in a semiconductor layer provided on an insulating layer in a stable state.

The above, other objects and novel features of the present invention will become apparent from the description of the present SPECIFICATION and the accompanying drawings.

SUMMARY OF THE INVENTION

Summaries of typical aspects of the present invention as disclosed in the present application will be described in brief as follows:

A semiconductor device having a field effect transistor formed in a semiconductor layer provided on a insulating layer comprises a body electrode electrically connected to a channel forming region of the field effect transistor, and a back gate electrode provided below the insulating layer and opposed to the channel forming region of the field effect transistor.

In the case of a partial depletion type field effect transistor, a potential for inducing an electrical charge of conduction type opposite to a channel formed in an upper portion of the channel forming region of the field effect transistor, in a lower portion of the semiconductor layer opposite to the back gate electrode, is applied to each of the body electrode and the back gate electrode.

In the case of a complete depletion type field effect transistor, a potential (negative potential in the case of the n channel conduction type) for drawing or draining carriers of a conduction type opposite to that of the channel formed in the upper portion of the channel forming region of the field effect transistor is applied to the body electrode, and a potential for inducing an electrical charge of a conduction type opposite to that of the channel formed in the upper portion of the channel forming region of the field effect transistor, in a lower portion of the semiconductor layer opposite to the back gate electrode, is applied to the back gate electrode.

According to the above-described means, the following operation and effects can be obtained.

(1) In the case of a partial depletion type field effect transistor, a channel of a conduction type opposite to a channel formed in an upper portion of a channel forming region thereof is formed at a lower portion (bottom) of the channel forming region. Since carriers (holes in the case of the n channel conduction type and electrons in the case of the p channel conduction type) generated in a high field region near a drain thereof flow into a body electrode through the channel formed in the lower portion of the channel forming region, an increase in potential in a neutral region of the channel forming region can be controlled. It is thus possible to increase the withstand voltage for the drain of the partial depletion type field effect transistor. Further, the stabilization of a threshold voltage thereof can be achieved.

Since the withstand voltage for the drain can be rendered high, high-voltage aging can be carried out.

Further, since the withstand voltage for the drain can be increased and the stabilization of the threshold voltage can be achieved, the threshold voltage of the partial depletion type field effect transistor can be changed in a stable state.

Furthermore, since the threshold voltage (Vth) of time partial depletion type field effect transistor can be varied in the stable state, a leakage current test at standby can be carried out.

(2) In the case of a complete depletion type field effect transistor, carriers (holes in the case of n channel conduction type and electrons in the case of p channel conduction type) generated in a high field region near a drain thereof are drained to a body electrode. Therefore, no carriers flow into a source region. Thus, since no bipolar operation is carried out, the withstand voltage for the drain of the complete depletion type field effect transistor can be increased. Further, the stabilization of a threshold voltage thereof can be achieved.

Since the withstand voltage for the drain can be set high, high-voltage aging can be carried out.

Further, since the carriers of a conduction type opposite to that of a channel formed in an upper portion of a channel forming region are drained by the body electrode, the threshold voltage of the complete depletion type field effect transistor can be changed in a stable state according to the potential of a back gate electrode.

Furthermore, since the threshold voltage (Vth) of the complete depletion type field effect transistor can be changed in the stable state, a leakage current test at standby can be carried out.

Incidentally, when a potential for injecting an electrical charge of a conduction type opposite to that of the channel formed in the upper portion of the channel forming region is applied to the body electrode in the complete depletion type field effect transistor, it assumes a partial depletion type without taking on the aspects of a complete depletion type. In this case, the threshold voltage can be changed according to the potential of the body electrode as in the partial depletion type field effect transistor.

BRIEF DESCRIPTION OF THE DRAWINGS

FIGS. 10(A) to 10(F) are fragmentary cross-sectional views showing steps of a method of manufacturing the semiconductor device;

FIGS. 13(A) to 13(J) are fragmentary cross-sectional views showing steps of a method of manufacturing the semiconductor device;

BEST MODE FOR CARRYING OUT THE INVENTION

Embodiments of the present invention will be described in detail with reference to the accompanying drawings.

Embodiment 1

In the present embodiment, an example in which the present invention is applied to a semiconductor device having a partial depletion type field effect transistor, will be explained.

Figure 1:
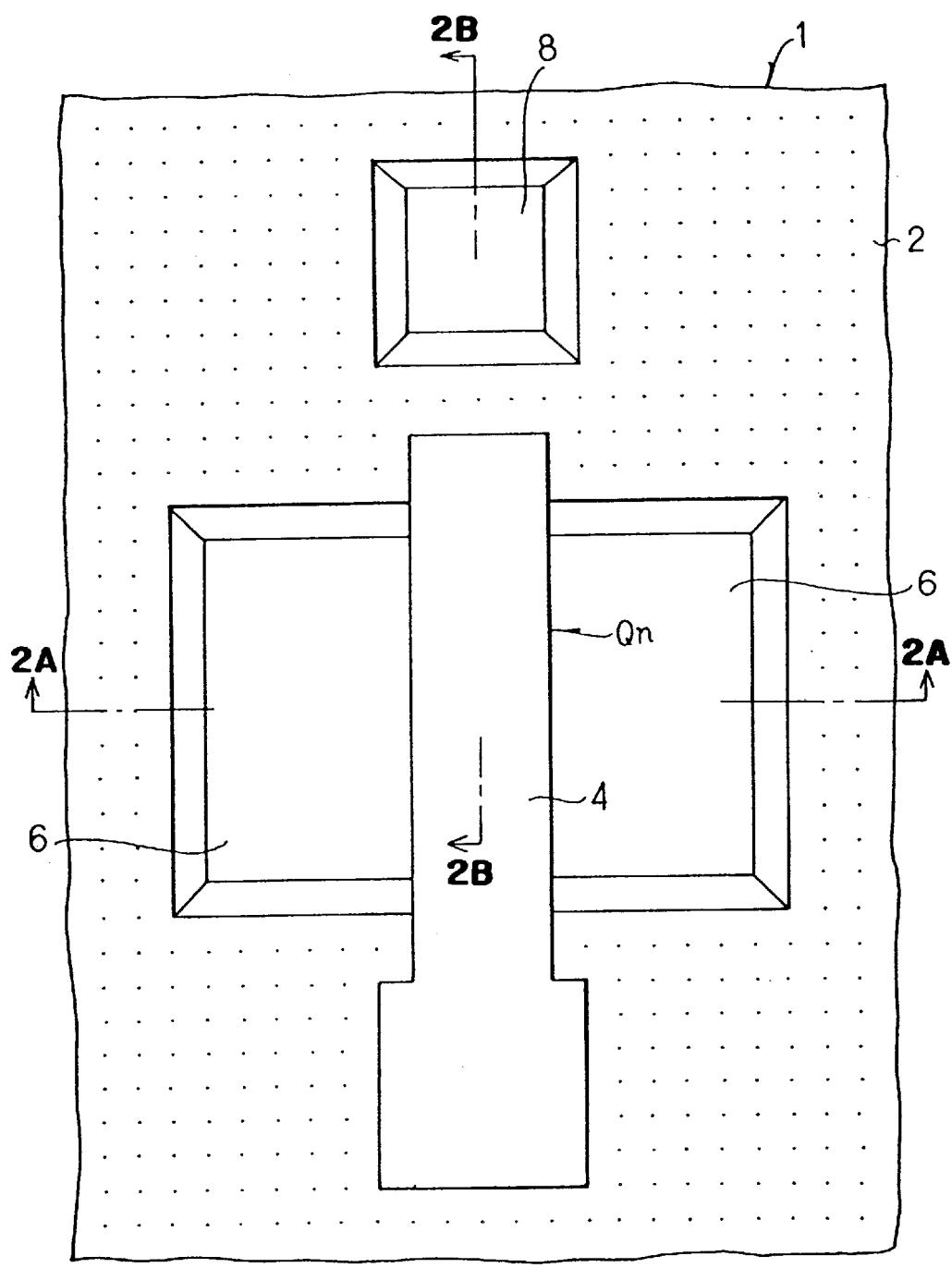
FIG. 1 is a fragmentary plan view of a semiconductor device showing an embodiment 1 of the present invention.

FIG. 1 is a fragmentary plan view of a semiconductor device showing the embodiment 1 of the present invention.

Figure 2A:
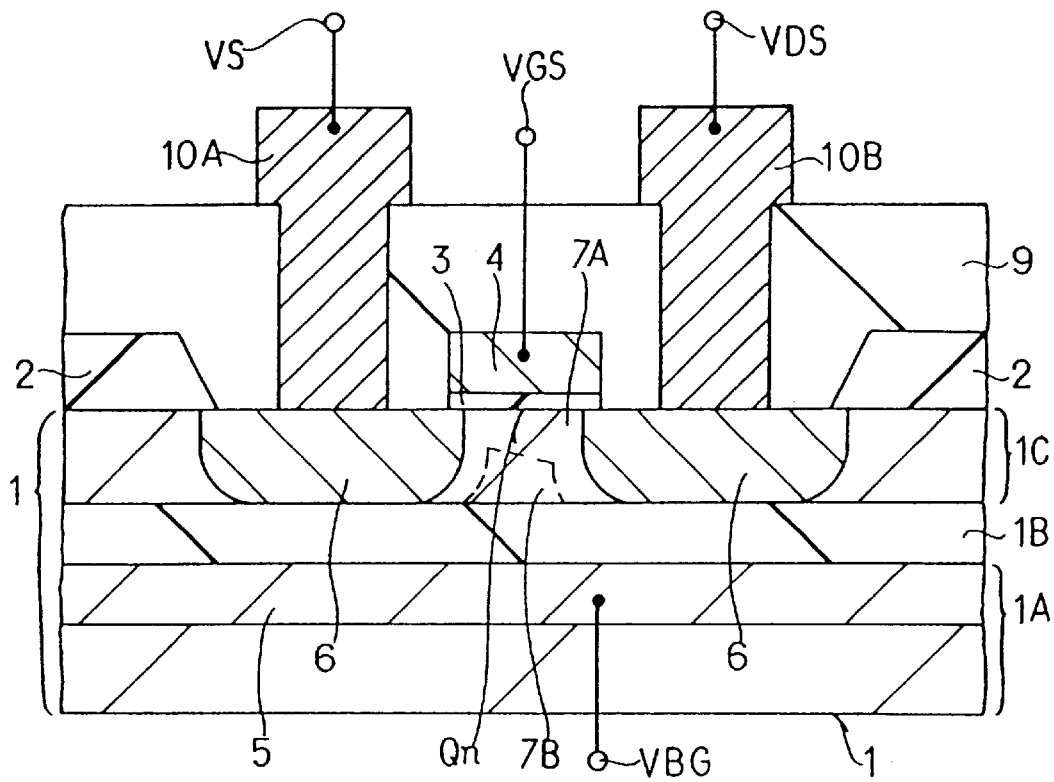
FIGS. 2(A) and 2(B) are fragmentary cross-sectional views of the semiconductor device as seen along lines A—A and B—B, respectively, in FIG. 1.
Figure 2B:
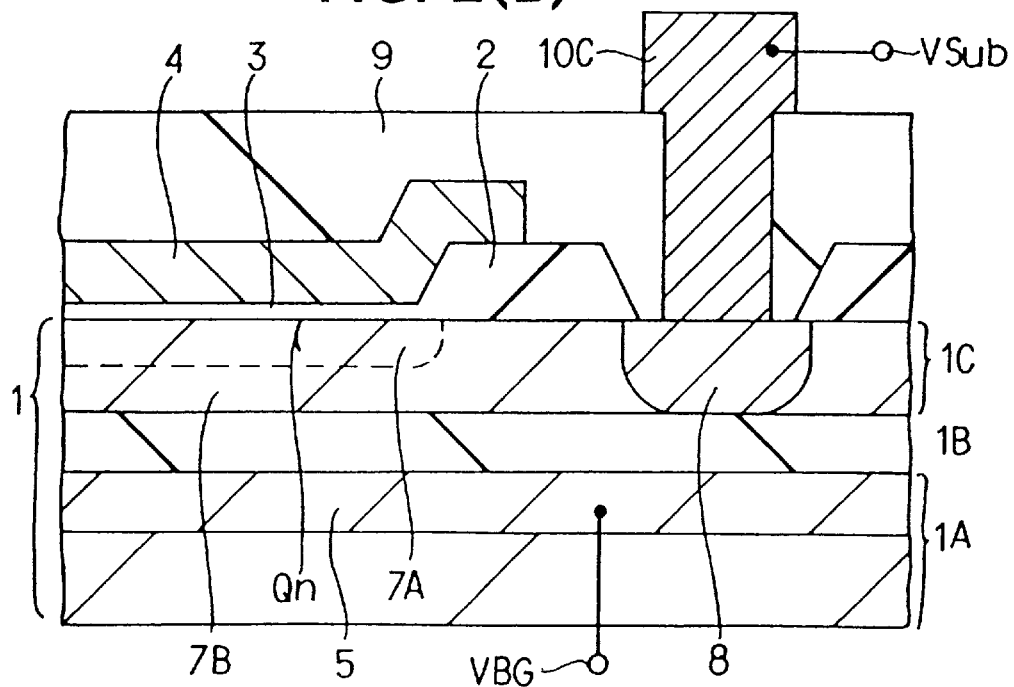
Figure 3A:
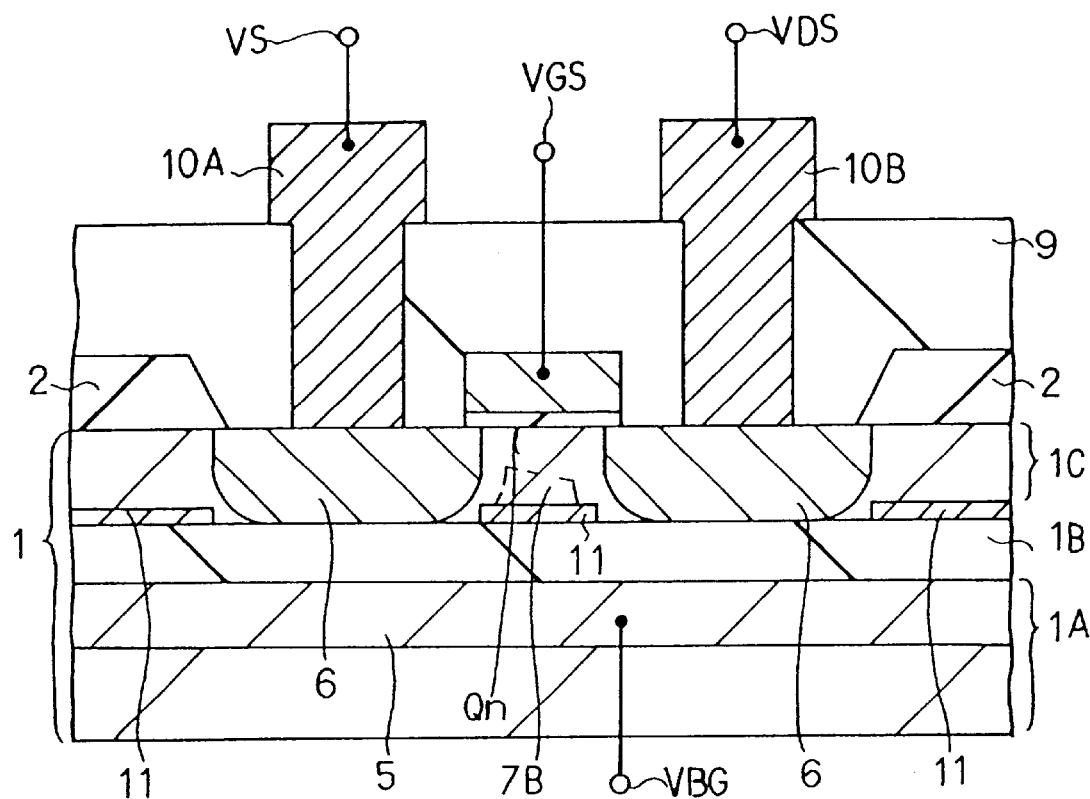
FIGS. 3(A) and 3(B) are fragmentary cross-sectional views of the semiconductor device as seen along lines A—A and B—B, respectively in FIG. 1.
Figure 3B:
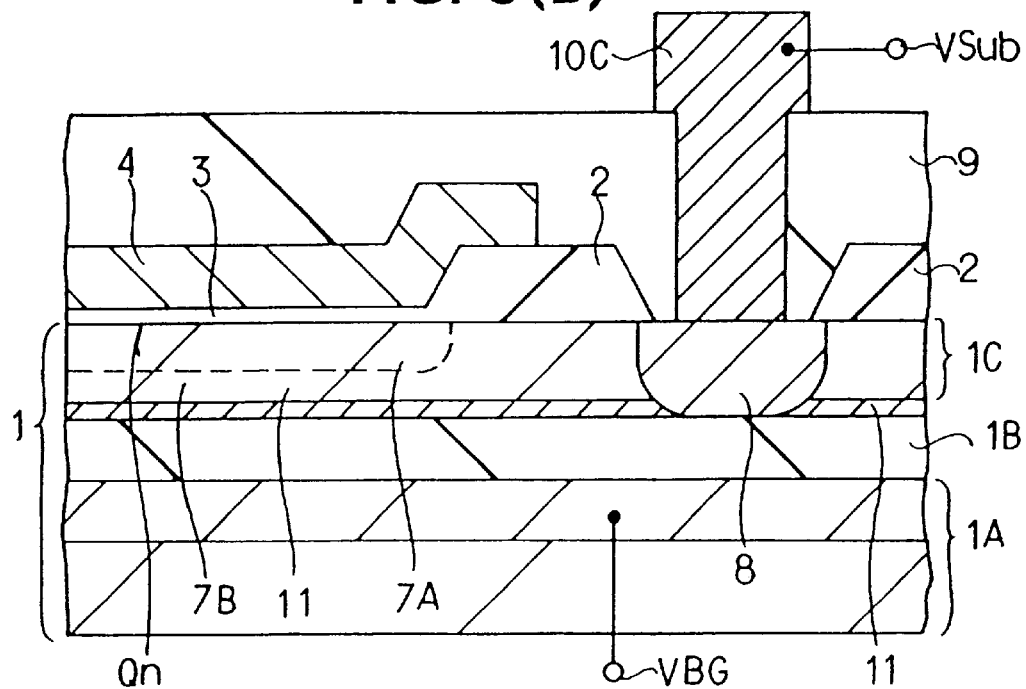

FIG. 2(A) and FIG. 3(A) are, respectively, cross-sectional views cut in a position taken along line A—A in FIG. 1. FIG. 2(B) and FIG. 3(B) are, respectively, cross-sectional views cut in a position taken along line B—B in FIG. 1. Incidentally, an illustration of each layer above a gate electrode 4 to be described later is omitted in FIG. 1 to make it easy to understand the drawing. In FIGS. 2(A), 2(B) and 3(A), 3(B), illustrations of layers above wires or interconnections (10A, 10B and 10C) to be described later are omitted to make it easy to understand the drawings.

As shown in FIGS. 1, 2(A) and 2(B), the semiconductor device is comprised principally of a semiconductor base 1. The semiconductor base 1 is comprised of a so-called SOI (Silicon On Insulator) structure wherein an insulating layer 1B composed of a silicon oxide film is provided between a p type semiconductor substrate 1A composed of monocrystal silicon and a semiconductor layer 1C composed of monocrystal silicon.

A field insulating film 2 composed of, for example, a silicon oxide film is provided on element-to-element separation regions of the semiconductor layer 1C. A field effect transistor Qn is formed in an element forming region of the semiconductor layer 1C, whose periphery is defined by the field insulating film 2. In the present embodiment, the field effect transistor Qn is formed as a partial depletion type.

Boron (B) is introduced into each region of the semiconductor layer 1C, in which the field effect transistor Qn is formed, and it is formed as a p type semi-conductor region.

The field effect transistor Qn principally comprises a channel forming region 1C comprised of a p type semiconductor layer 1C, a gate insulator 3, a gate electrode 4, and a pair of n type semiconductor regions 6, which serve as source and drain regions, respectively. Namely, the field effect transistor Qn is formed in an n channel conduction type. The gate insulator 3 is formed of, for example, a thermal oxidation silicon film. The gate electrode 4 is formed of a polycrystalline silicon film in which, for example, phosphorus (P) is introduced as an impurity. The pair of n type semiconductor regions 6, serving as the source and drain regions, are formed in self-alignment with the gate electrode 4 and provided within the p type semiconductor layer 1C.

The field effect transistor Qn is constructed in the form of a structure wherein the respective bottoms of the pair of n type semiconductor regions 6 corresponding to the source and drain regions are brought into contact with the insulating layer 1B of the semiconductor base 1. In the field effect transistor Qn, pn junction capacities (parasitic capacities) added to the source and drain regions can be respectively reduced by portions equivalent to the contact areas of the respective bottoms of the pair of n type semiconductor regions 6. It is therefore possible to achieve a fast switching speed.

In the field effect transistor Qn, the periphery of the channel forming region thereof is surrounded by the pair of n type semiconductor regions 6 and the insulating layer 1B of the semiconductor base 1.

The p type semiconductor layer 1C is provided with a p type semiconductor region 8 used as a body electrode. The p type semiconductor region 8 is set to a high impurity concentration as compared with an impurity concentration of the p type semiconductor layer 1C and is electrically connected to the channel forming region of the field effect transistor Qn.

A p type semiconductor region 5, which serves as a back gate electrode, is provided on a principal surface of the p type semiconductor substrate 1A. The p type semiconductor region 5 is set to a high impurity concentration as compared with an impurity concentration of the p type semiconductor substrate 1A and is provided so as to contact the insulating layer 1B. Further, the p type semiconductor region 5 is provided so as to be opposed to the p type semiconductor layer 1C in which the field effect transistor Qn is constituted. Namely, the p type semiconductor region 5 serving as the back gate electrode is provided so as to be opposed to each of the channel forming region of the field effect transistor Qn and the p type semiconductor region 8 used as the body electrode.

The interconnection 10A is electrically connected to one of the pair of n type semiconductor regions 6 through its corresponding connecting hole defined in an interlayer dielectric 9, whereas the interconnection 10B is electrically connected to the other of the n type semiconductor regions 6 through its corresponding connecting hole defined in the interlayer dielectric 9. A VS potential (=0[V]) is applied to the interconnection 10A, and a VDS potential ($\geq$VS potential) is applied to the interconnection 10B. Namely, the VS potential is applied to one n type semiconductor region 6, whereas the VDS potential which is higher than the VS potential is applied to the other n type semiconductor region 6. Incidentally, a VGS potential is applied to the gate electrode 4.

The interconnection 10C is electrically connected to the p type semiconductor region 8 used as the body electrode through its corresponding connecting hole defined in the interlayer dielectric 9. A VSub potential ($\leq$0[V]) lower than the VS potential and VDS potential is applied to the interconnection 10C. Namely, the VSub potential is applied to the p type semiconductor region 8 used as the body electrode.

A VBG potential (<0[V]), which lower than the VS potential, and the VDS potential is applied to the p type semiconductor region 5 which serves as the back gate electrode. The VBG potential is supplied from the principal surface side of the semiconductor base 1.

In the semiconductor device, a depleted region 7A is developed in the channel forming region of the field effect transistor Qn owing to a gate electric field and source and drain potentials. Some of the depleted region 7A serves as a neutral region 7B. When the VGS potential is applied to the gate electrode 4, the VS potential (=0[V]) is applied to one n type semiconductor region 6, the VDS potential ($\geq$VS potential) is applied to the other n type semiconductor region 6, the VSub potential ($\leq$0[V]) is applied to the p type semiconductor region 8 used as the body electrode, and the VBG potential (<0[V]) is applied to the p type semiconductor region 5 used as the back gate electrode, a channel 11 of a conduction type back opposite to that of a channel formed in an upper portion of the channel forming region of the field effect transistor Qn is formed at a lower portion (bottom) of the p type semiconductor layer 1C opposite to the p type semiconductor region 5 used as the back gate electrode, as seen in FIGS. 3(A) and 3(B). Since the p type semiconductor region 5 used as the back gate electrode is provided in opposing relationship to each of the channel forming region of the field effect transistor Qn and the p type semiconductor region 8 used as the body electrode in the present embodiment, the channel forming region of the field effect transistor Qn and the p type semiconductor region 8 used as the body electrode are kept in a state of being connected to each other through the channel 11. Since holes produced in a high field region lying in the vicinity of the drain flow into the p type semiconductor region 8 used as the body electrode through the channel 11 formed at the lower portion of the channel forming region, a rise in the potential of the neutral region 7B in the channel forming region can be controlled. Thus, the withstand voltage of the drain of the partial depletion type field effect transistor Qn can be rendered high. It is also possible to stabilize the threshold voltage (Vth).

Since the drain withstand voltage can be set high, high-voltage aging can be carried out. The aging is done in a state in which the potential is applied to the back gate electrode or the back gate electrode and body electrode. The aging refers to a screening test for activating circuits in a semiconductor device under a use condition (in a load-applied state) severer than a use condition for each customer, generating one brought to defectiveness when being in use by the customer, in a given sense, a defect at an increasingly fast rate, and eliminating each defective device in the initial stage prior to the shipment to the customer.

Further, since the drain withstand voltage can be increased and the stabilization of the threshold voltage (Vth) can be achieved, the threshold voltage (Vth) of the partial depletion type field effect transistor Qn can be changed in a stable state.

Since the threshold voltage of the partial depletion type field effect transistor can be varied in the stable state, a leakage current test at standby can be carried out. The leakage current test is carried out in a state in which the potential has been applied to the back gate electrode or the back gate electrode and body electrode, in such a manner that the threshold voltage of the field effect transistor is increased.

Further, the potential applied to the back gate electrode or the back gate electrode and body electrode can be changed with time so as to vary the characteristic of the field effect transistor Qn.

Incidentally, while an n channel conduction type field effect transistor has been described in the present embodiment, the present invention can obtain a similar effect even in the case of a p channel type conduction type field effect transistor.

Embodiment 2

In the present embodiment, an example in which the present invention is applied to a semiconductor device having a complete depletion type field effect transistor, will be described.

Figure 4:
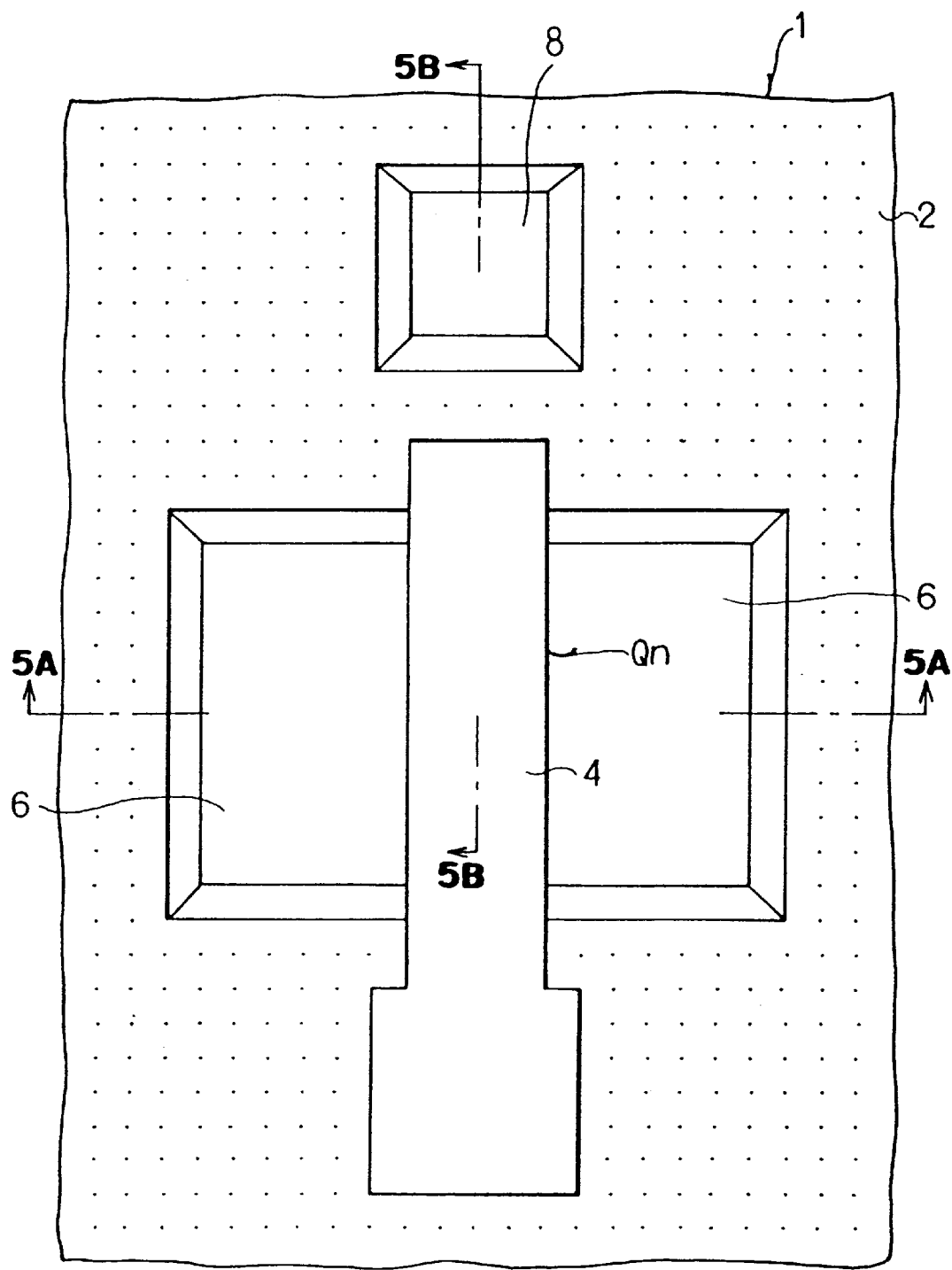
FIG. 4 is a fragmentary plan view of a semiconductor device showing an embodiment 2 of the present invention.
Figure 5A:
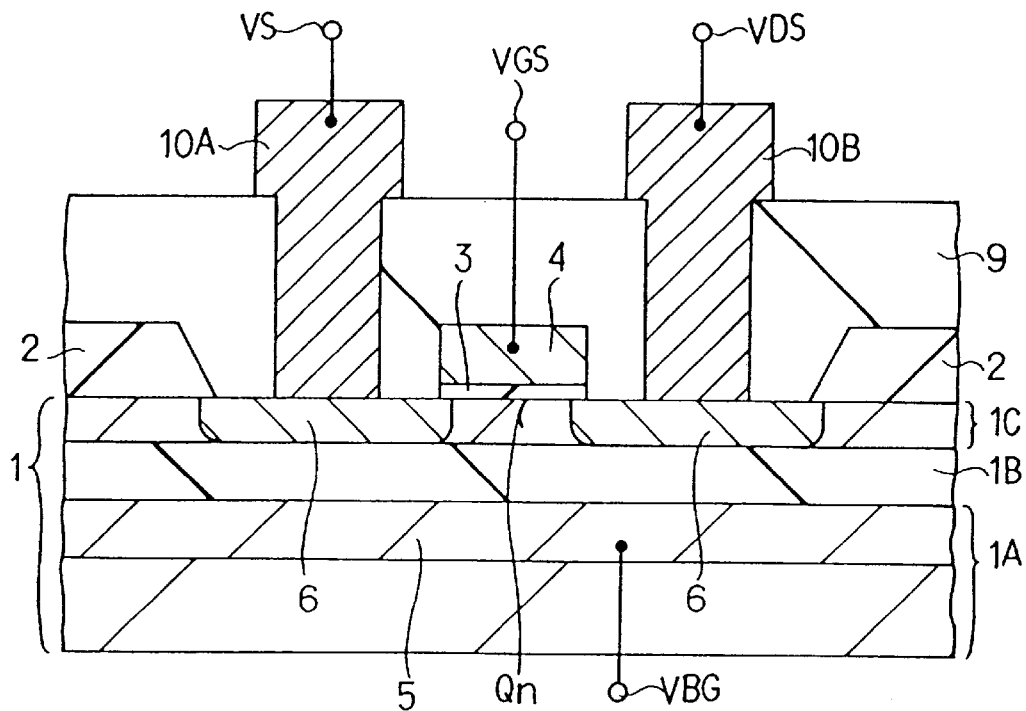
FIGS. 5(A) and 5(B) are fragmentary cross-sectional views of the semiconductor device as seen along lines C—C and D—D, respectively, in FIG. 4.
Figure 5B:
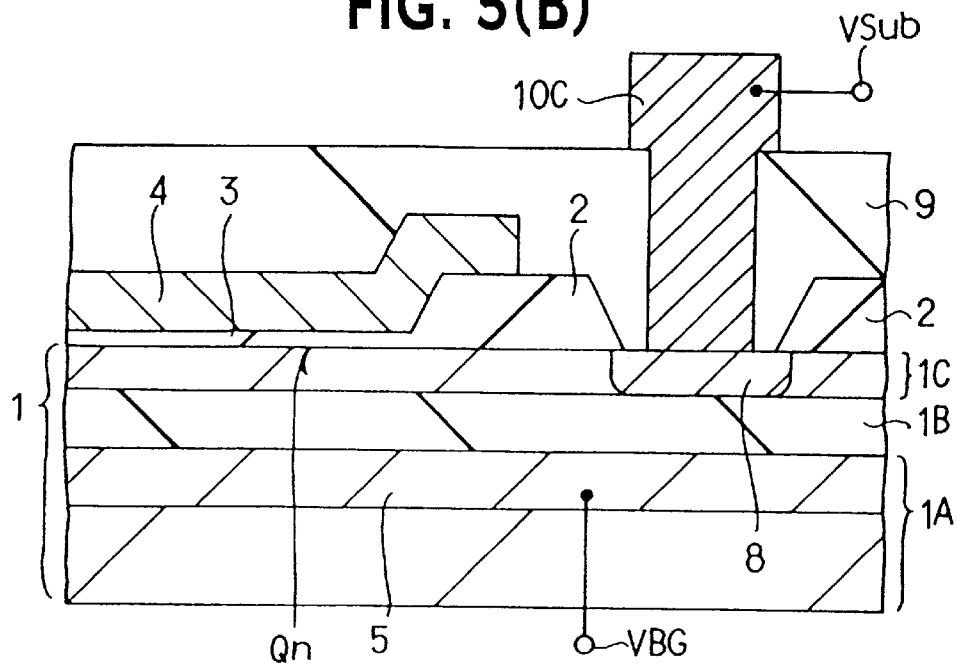

FIG. 4 is a fragmentary plan view of the semiconductor device showing the embodiment of the present invention. FIG. 5(A) is a cross-sectional view cut in a position taken along line C—C in FIG. 4, and FIG. 5(B) is a cross-sectional view cut in a position taken along line D—D in FIG. 4. Incidentally, an illustration of each layer above a gate electrode 4 to be described later is omitted in FIG. 4 to make it easy to understand the drawing. In FIGS. 5(A) and 5(B), illustrations of layers above wires or interconnections (10A, 10B and 10C) to be described later are omitted to make it easy to understand the drawings.

As shown in FIGS. 5(A) and 5(B), the semiconductor device according to the present embodiment is substantially identical in structure to the aforementioned embodiment 1. The present embodiment is different from the aforementioned embodiment in that a field effect transistor Qn is constructed as a complete depletion type, and the thickness of the p type semiconductor layer 1C is thinner than that of the p type semiconductor layer 1C of the aforementioned embodiment 1. Further, a VBG potential (<0[V]) is applied to a p type semiconductor region 5 used as a back gate electrode, and a VSub potential ($\geq 0[V]$) is applied to a p type semiconductor region 8 used as a body electrode.

The field effect transistor Qn employed in the present embodiment is constructed as a complete depletion type. When a VSG potential (>Vth) is applied to a gate electrode 4, a VS potential (0[V]) is applied to one n type semiconductor region 6, a VDS potential ($\geq$VS potential) is applied to the other n type semiconductor region 6, the VSub potential ($\geq 0[V]$) is applied to the p type semiconductor region 8 used as the body electrode, and the VBG potential ($\geq 0[V]$) is applied to the p type semiconductor region 5 used as the back gate electrode, holes developed in a high field region lying in the vicinity of a drain are drawn or drained to the body electrode. Therefore, no holes flow into a source region. Thus, since no bipolar operation is performed, the withstand voltage for the drain of the complete depletion type field effect transistor Qn can be increased. It is also possible to stabilize the threshold voltage thereof.

Since the drain withstand voltage can be set high, high-voltage aging can be carried out. The aging is done in a state in which the potential is applied to the back gate electrode or the back gate electrode and body electrode.

Since carriers of a conduction type opposite to that of a channel formed in an upper portion of a channel forming region are drawn or drained by the body electrode, the threshold voltage (Vth) of the complete depletion type field effect transistor Qn can be varied in a stable state by the potential applied to the back gate electrode (p type semiconductor region 5).

Since the threshold voltage of the partial depletion type field effect transistor can be changed in the stable state, a leakage current test at standby can be carried out. The leakage current test is carried out in a state in which the potential has been applied to the back gate electrode or the back gate electrode and body electrode, in such a manner that the threshold voltage of the field effect transistor is increased.

Further, the potential applied to the back gate electrode or the back gate electrode and body electrode can be changed with time so as to vary the characteristic of the field effect transistor Qn.

When a potential for injecting electrical charges of conduction type opposite to the channel formed in the upper portion of the channel forming region is applied to the body electrode (p type semiconductor region 8) in the complete depletion type field effect transistor Qn employed in the present embodiment, the field effect transistor results in a partial depletion type without assuming the complete depletion type. As described in the partial depletion type field effect transistor employed in the aforementioned embodiment 1 in this case, the threshold voltage (Vth) can be changed by the potential applied to the body electrode.

Figure 6:
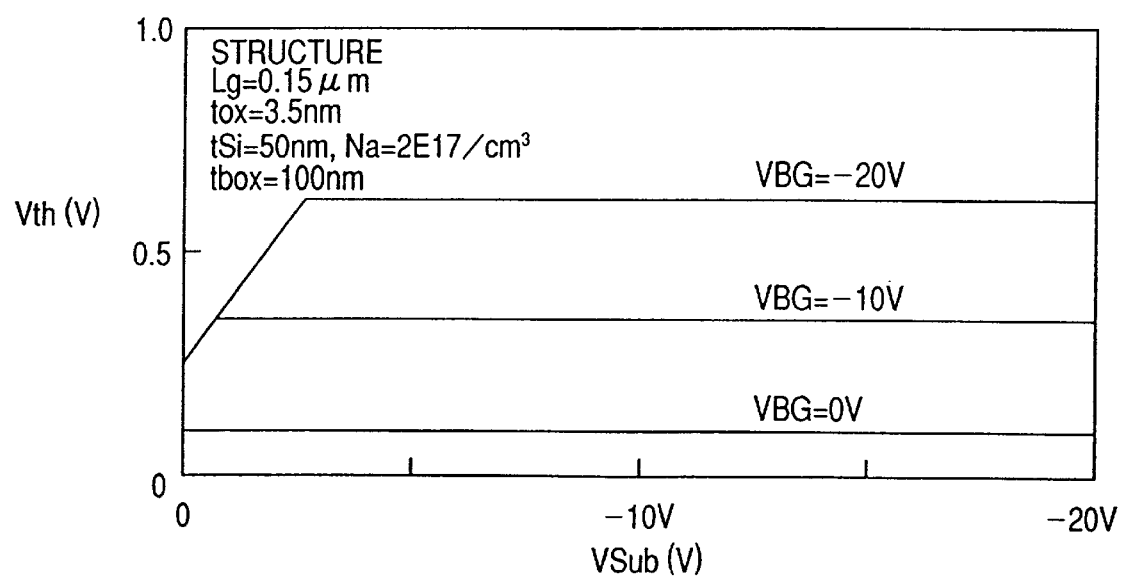
FIG. 6 is a graph showing the relationship between potentials applied to a body electrode and a back gate electrode and a threshold voltage.

FIG. 6 shows a result obtained by examining the dependence of potentials applied to the body electrode and back gate electrode employed in the complete depletion type field effect transistor Qn on a threshold voltage thereof. When a minus potential is applied to the p type semiconductor region 8 used as the body electrode, the threshold voltage can be changed up to a logical value of a threshold voltage based on the potential application to the back gate electrode. In FIG. 6, Lg=0.15 [μm] indicates a gate length of the gate electrode 4, tox=3.5 [nm] indicates the thickness of a gate insulator 3, tSi=50 [nm] indicates the thickness of the p type semiconductor layer 1C, Na=2E17 [atoms/cm$^3$] indicates an impurity concentration of the p type semiconductor layer 1C, and tbox=100 [nm] indicates the thickness of an insulating layer 1B.

Since a channel of a conduction type opposite to that of the channel formed in the upper portion of the channel forming region is formed at a lower portion (bottom) of the channel forming region when a potential at an inclined portion shown in FIG. 6 is applied to the back gate electrode and body electrode, a partial depletion type field effect transistor is obtained. Since the holes are drawn or drained or they are injected from the p type semiconductor region 8 until the potential applied to the lower portion of the channel forming region becomes equal to the potential applied to the p type semiconductor region 8 used as the body electrode, the potential of the channel forming region is stable and the threshold voltage is also stable.

Incidentally, while an n channel conduction type field effect transistor has been described in the present embodiment, the present invention can obtain a similar effect even in the case of a p channel conduction type field effect transistor.

Embodiment 3

In the present embodiment, an example in which the present invention is applied to a semiconductor device having a complete depletion type field effect transistor, will be explained.

Figure 7:
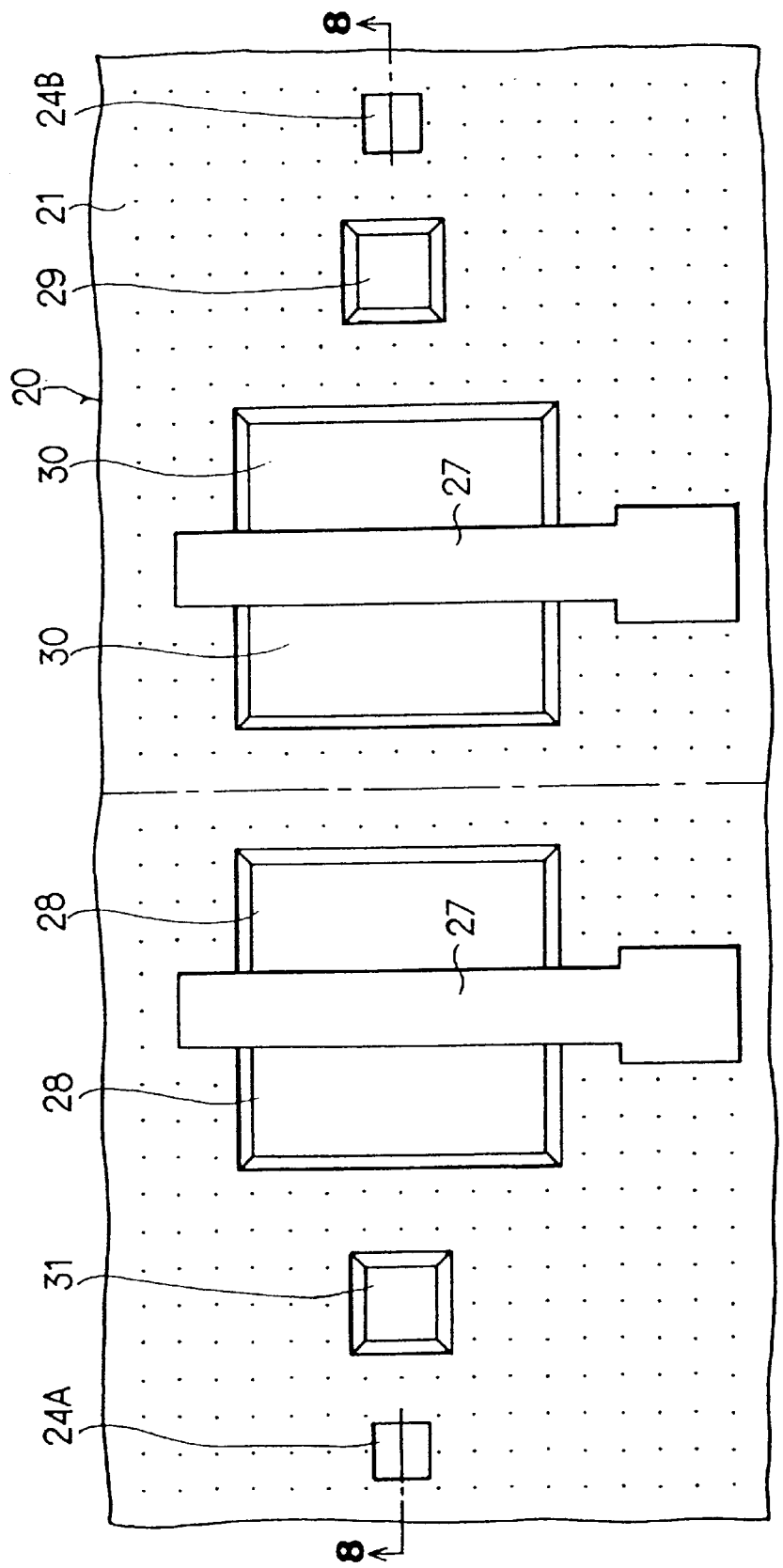
FIG. 7 is a fragmentary plan view of a semiconductor device showing an embodiment 3 of the present invention.
Figure 8:
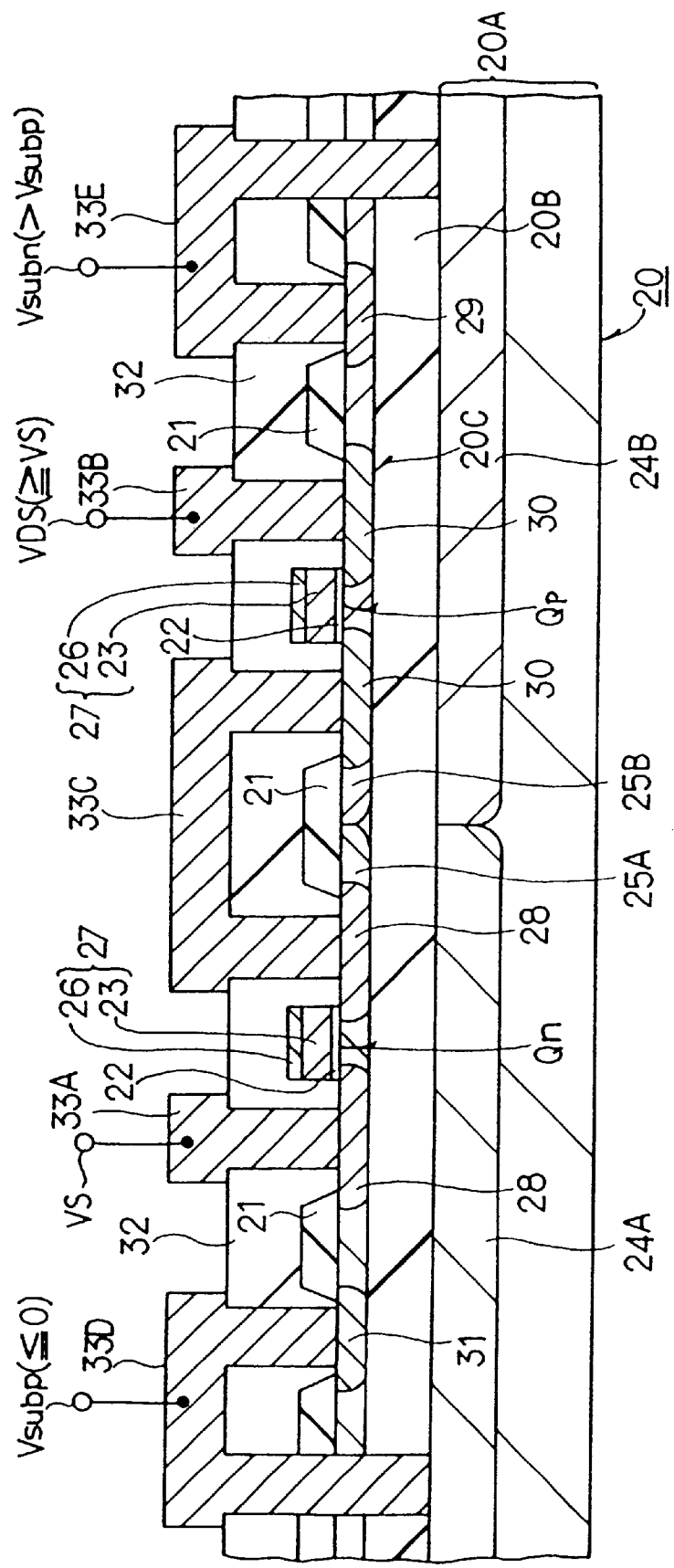
FIG. 8 is a fragmentary cross-sectional view cut in a position taken along line E—E in FIG. 7.
Figure 9:
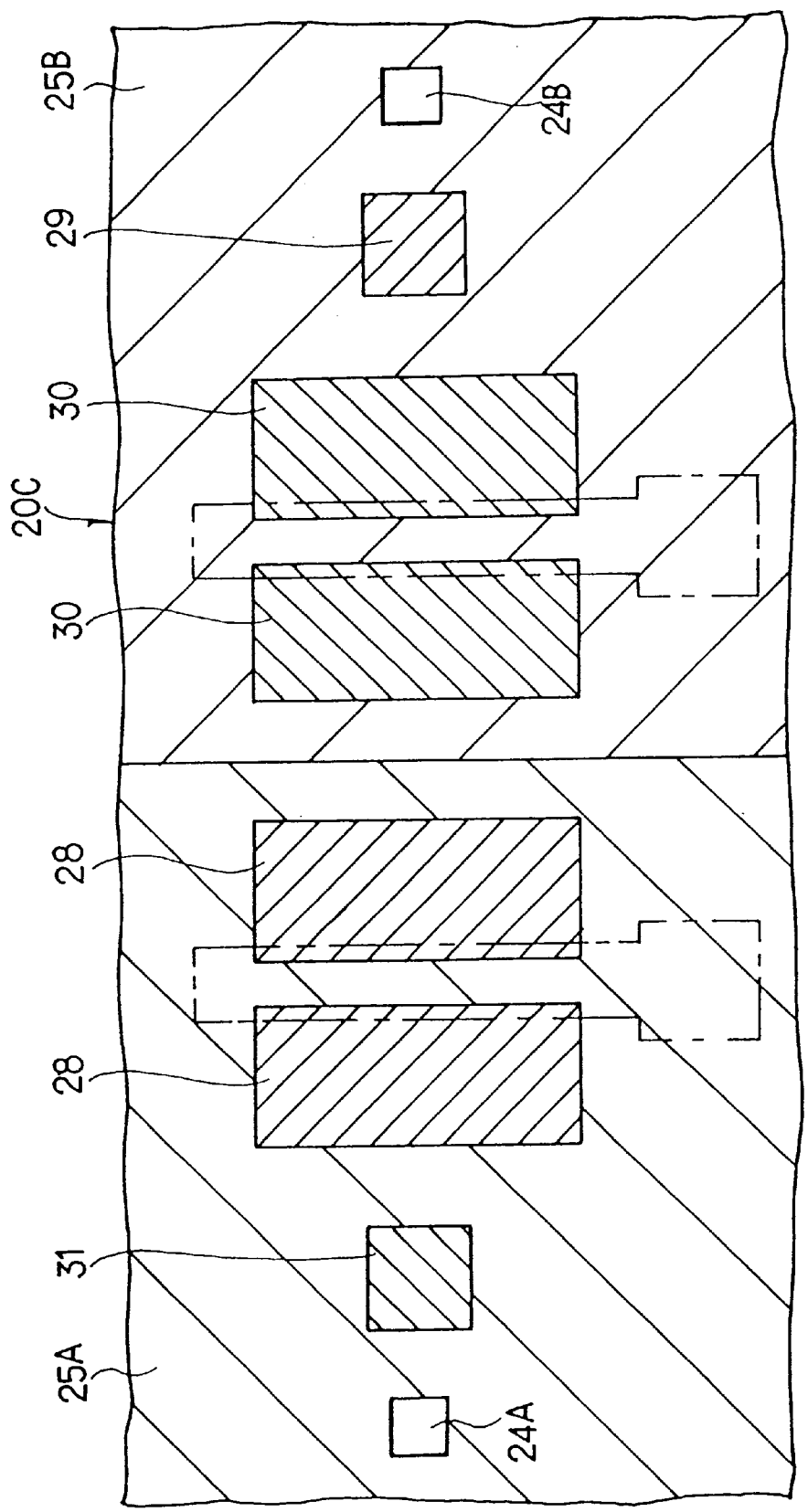
FIG. 9 is a fragmentary plan view showing layouts of respective semiconductor regions shown in FIG. 7.

FIG. 7 is a fragmentary plan view of the semiconductor device showing the embodiment of the present invention, FIG. 8 is a cross-sectional view cut in a position taken along line E—E shown in FIG. 7, and FIG. 9 is a plan view showing layouts of respective semiconductor regions in FIG. 7, respectively. Incidentally, an illustration of each layer above each gate electrode 27 to be described later is omitted in FIG. 7 to make it easy to understand the drawing. Further, an illustration of each layer above a wire or interconnection 33A to be described later is omitted in FIG. 8 to make it easy to understand the drawing.

As shown in FIGS. 7 and 8, the semiconductor device is comprised principally of a semiconductor base 20. The semiconductor base 20 is comprised of a so-called SOI (Silicon On Insulator) structure wherein an insulating layer 20B composed of a silicon oxide film is provided between a p type semiconductor substrate 20A composed of monocrystal silicon and a semiconductor layer 20C composed of monocrystal silicon.

A field insulating film 21 composed of, for example, a silicon oxide film is provided on element-to-element separation regions of the semiconductor layer 20C. An n channel conduction type field effect transistor Qn and a p channel conduction type field effect transistor Qp are formed in an element forming region of the semiconductor layer 20C, whose periphery is defined by the field insulating film 2. In the present embodiment, the n channel conduction type field effect transistor Qn and the p channel conduction type field effect transistor Qp are respectively formed in a complete depletion type.

The field effect transistor Qn is formed in a p type semiconductor region 25A provided within the semiconductor layer 20C. The field effect transistor Qn is comprised principally of a channel forming region comprised of the p type semiconductor region 25A, a gate insulator 22, a gate electrode 27, and a pair of n type semiconductor regions 28 which serve as source and drain regions, respectively. The gate insulator 22 is formed of, for example, a thermal oxidation silicon film. The gate electrode 27 is formed of, for example, a polycrystalline silicon film 23 and a W/TiN film 26 provided on the polycrystalline silicon film 23. For example, phosphorus (P) is introduced into the polycrystalline silicon film 23 as an impurity for reducing a resistance value.

The field effect transistor Qp is formed in an n type semiconductor region 25B provided within the semiconductor layer 20C. The field effect transistor Qp is comprised principally of a channel forming region comprised of the n type semiconductor region 25B, a gate insulator 22, a gate electrode 27, and a pair of p type semiconductor regions 30 which serve as source and drain regions respectively. The gate insulator 22 is formed of, for example, a thermal oxidation silicon film. The gate electrode 27 is formed of, for example, a polycrystalline silicon film 23 and a W/TiN film 26 provided on the polycrystalline silicon film 23. For example, boron (B) is introduced into the polycrystalline silicon film 23 as an impurity for reducing a resistance value.

The field effect transistor Qn is constructed in the form of a structure wherein the respective bottoms of the pair of n type semiconductor regions 28 corresponding to the source and drain regions are brought into contact with the insulating layer 20B of the semiconductor base 20. In the field effect transistor Qn, pn junction capacities (parasitic capacities) added to the source and drain regions can be respectively reduced by portions equivalent to the contact areas of the respective bottoms of the pair of n type semiconductor regions 28. It is therefore possible to achieve a fast switching speed.

The periphery of the channel forming region of the field effect transistor Qn is surrounded by the pair of n type semiconductor regions 28 corresponding to the source and drain regions and the insulating layer 20B of the semiconductor base 20.

The field effect transistor Qp is constructed in the form of a structure wherein the respective bottoms of the pair of p type semiconductor regions 30 corresponding to the source and drain regions are brought into contact with the insulating layer 20B of the semiconductor base 20. In the field effect transistor Qp, pn junction capacities (parasitic capacities) added to the source and drain regions can be respectively reduced by portions equivalent to the contact areas of the respective bottoms of the pair of p type semiconductor regions 30. It is therefore possible to achieve a fast switching speed.

The periphery of the channel forming region of the field effect transistor Qp is surrounded by the pair of p type semiconductor regions 30 corresponding to the source and drain regions and the insulating layer 20B of the semiconductor base 20.

As shown in FIGS. 7, 8 and 9, the p type semiconductor region 25A is provided with a p type semiconductor region 31 used as a body electrode. The p type semiconductor region 31 is set to a high impurity concentration as compared with an impurity concentration of the p type semiconductor region 25A and is electrically connected to its corresponding channel forming region of the field effect transistor Qn.

The n type semiconductor region 25B is provided with an n type semiconductor region 29 used a body electrode. The n type semiconductor region 29 is set to a high impurity concentration as compared with an impurity concentration of the n type semiconductor region 25B and is electrically connected to its corresponding channel forming region of the field effect transistor Qp.

A p type semiconductor region 24A, which serves as a back gate electrode, is provided on a principal surface of the p type semiconductor substrate 20A. The p type semiconductor region 24A is set to a high impurity concentration as compared with an impurity concentration of the p type semiconductor substrate 20A and is provided so as to contact the insulating layer 20B. Further, the p type semiconductor region 24A is provided so as to be opposed to the p type semiconductor region 25A in which the field effect transistor Qn is formed. Namely, the p type semiconductor region 24A used as the back gate electrode is provided so as to be opposed to each of the channel forming region of the field effect transistor Qn and the p type semiconductor region 31 used as the body electrode.

An n type semiconductor region 24B used as a back gate electrode is provided on the principal surface of the p type semiconductor substrate 20A. The n type semiconductor region 24B is set to a high impurity concentration as compared with an impurity concentration of the p type semiconductor substrate 20A and is provided so as to make contact with the insulating layer 20B. Further, the n type semiconductor region 24B is provided so as to be opposed to the n type semiconductor region 25B in which the field effect transistor Qp is formed. Namely, the n type semiconductor region 24B used as the back gate electrode is provided so as to be opposed to each of the channel forming region of the field effect transistor Qp and the n type semiconductor region 29 used as the body electrode.

The interconnection 33A is electrically connected to one of the pair of n type semiconductor regions 28 of the field effect transistor Qn through its corresponding connecting hole defined in an interlayer dielectric 32. An interconnection 33C is electrically connected to the other n type semiconductor region 28 through its corresponding connecting hole defined in the interlayer dielectric 32.

An interconnection 33B is electrically connected to one of the pair of p type semiconductor regions 30 of the field effect transistor Qp through its corresponding connecting hole defined in the interlayer dielectric 32, whereas the interconnection 33C is electrically connected to the other p type semiconductor region 30 through its corresponding connecting hole defined in the interlayer dielectric 32.

The gate electrodes 27 of the field effect transistors Qn and Qp are electrically connected to each other. Namely, the semiconductor device is equipped with an inverter circuit comprised of the field effect transistors Qn and Qp.

An interconnection 33D is electrically connected to the p type semiconductor region 31 used as the body electrode through its corresponding connecting hole defined in the interlayer dielectric 32. The interconnection 33D is electrically connected to the p type semiconductor region 24A used as the back gate electrode through its connecting hole defined from the interlayer dielectric 32 to the insulating layer 20B. Namely, the same potential is applied to the p type semiconductor region 31 used as the body electrode and the p type semiconductor region 24A used as the back gate electrode.

An interconnection 33E is electrically connected to the n type semiconductor region 29 used as the body electrode through its corresponding connecting hole defined in the interlayer dielectric 32. The interconnection 33E is electrically connected to the n type semiconductor region 24B used as the back gate electrode through its corresponding connecting hole defined from the interlayer dielectric 32 to the insulating layer 20B. Namely, the same potential is applied to each of the n type semiconductor region 29 used as the body electrode and the n type semiconductor region 24B used as the back gate electrode.

A VS potential is applied to the interconnection 33A, a VSD potential ($\geq$VS potential) is applied to the interconnection 33B, a Vsubp potential (<0[V]) is applied to the interconnection 33D, a Vsubn potential (>Vsubp potential) is applied to the interconnection 33E, and an input signal is applied to the interconnection 33C. Incidentally, Vsubp potential$\leq$VS potential, Vsubn potential$\geq$VDS potential and Vsubp potential<Vsubn potential. Further, the n type semiconductor region 24B, the p type semiconductor region 24A and the p type semiconductor substrate 20A are held in a reverse-bias relationship.

A method of manufacturing the semiconductor device will next be explained with reference to FIGS. 10(A) through 10(F) (fragmentary cross-sectional views showing successive steps of the manufacturing method).

As shown in FIG. 10(A), a semiconductor base 20 having an SOI structure provided with an insulating layer 20B composed of a silicon oxide film between a p type semiconductor substrate 20A composed of monocrystal silicon and a semiconductor layer 20C composed of monocrystal silicon is first prepared. The p type semiconductor substrate 20A is set to an impurity concentration of about 1.5E15 [atoms/cm$^3$]. The insulating layer 20B is set to a thickness of about 100 [nm]. The semiconductor layer 20C is set to a thickness of about 50 and is not doped with an impurity.

Next, a field insulating film 21 composed of a silicon oxide film, which has a thickness of about 100 [nm], is formed on the entire surface of the semiconductor layer 20C by a CVD method and is thereafter subjected to patterning to thereby define or open an element forming region and a body electrode forming region of the semiconductor layer 20C as shown in FIG. 10(B). The patterning of the field insulating film 21 is carried out with a photoresist film as a mask.

Next, a thermal oxidation process is performed to form a gate insulator 22 composed of a thermal oxidation silicon film having a thickness of about 3.5 [nm] on the element forming region of the semiconductor layer 20C. The thermal oxidation process is carried out in an atmosphere of partial-pressure steam at 900 [°C.].

Next, as shown in FIG. 10(C), a polycrystalline silicon film 23 having a thickness of about 100 [nm] is formed on the entire surface of the semiconductor base 20 including the upper part of the gate insulator 22 by the CVD method.

Next, boron is selectively introduced into the polycrystalline silicon film 23 opposite to a p channel conduction type field effect transistor forming region of the semiconductor layer 20C as an impurity by ion implantation. Thereafter, phosphorous is selectively introduced into the polycrystalline silicon film 23 opposite to an n channel conduction type field effect transistor forming region of the semiconductor layer 20C as an impurity by ion implantation. The introduction of boron is carried out under the condition that the final introduced amount thereof is about 2E15 [atoms/cm$^2$] and the amount of energy at its introduction is about 7 [Kev]. The introduction of phosphorous is carried out under the condition that the final introduced amount thereof is about 2E15 [atoms/cm$^2$] and the amount of energy at its introduction is about 20 [Kev]. The introduction of boron is performed for the purpose of bringing the gate electrode of the p channel conduction type field effect transistor into a p type, whereas the introduction of phosphorous is carried out for the purpose of bringing the gate electrode of the n channel conduction type field effect transistor into an n type.

Next, a CMP (Chemical Mechanical Polishing) method is used to remove the polycrystalline silicon film 23 provided on the field insulating film 21.

Next, boron (B) is selectively introduced into the p type semiconductor substrate 20A opposite to the n channel conduction type field effect transistor forming region of the semiconductor layer 20C as the impurity by ion implantation to thereby form a p type semiconductor region 24A which serves as a back gate electrode. The introduction of boron is carried out under the condition that the final introduced amount thereof is about 5E12 [atoms/cm$^2$] and the amount of energy at its introduction is about 120 [Kev]. The introduction of boron is performed with a photoresist film as a mask.

Next, phosphorous (P) is selectively introduced into the p type semiconductor substrate 20A opposite to the p channel conduction type field effect transistor forming region of the semiconductor layer 20C as the impurity by ion implantation to thereby form an n type semiconductor region 24B which serves as a back gate electrode. The introduction of phosphorous is performed under the condition that the final introduced amount thereof is about 5E12 [atoms/cm$^2$] and the amount of energy at its introduction is about 260 [Kev]. The introduction of phosphorous is carried out with a photoresist film as a mask. Thus, back gate potentials can be respectively independently applied to the back gate electrode of the field effect transistor Qn and the back gate electrode of the field effect transistor Qp.

Next, boron is selectively introduced into the n channel conduction type field effect transistor forming region of the semiconductor layer 20C as the impurity by ion implantation to thereby form a p type semiconductor region 25A. The introduction of boron is carried out under the condition that the final introduced amount thereof is about 1.5E12 [atoms/cm$^2$] and the amount of energy at its introduction is about 40 [Kev]. The introduction of boron is performed with a photoresist film as a mask.

Next, phosphorous is selectively introduced into the p channel conduction type field effect transistor forming region of the semiconductor layer 20C as the impurity by ion implantation to thereby form an n type semiconductor region 25B. The introduction of phosphorous is carried out under the condition that the final introduced amount thereof is about 1.5E12 [atoms/cm$^2$] and the amount of energy at its introduction is about 100 [Kev]. The introduction of phosphorous is carried out with a photoresist film as a mask. According to this process, the impurity concentration of the semiconductor layer 20C in the n channel conduction type field effect transistor forming region and the impurity concentration of the semiconductor layer 20C in the p channel conduction type field effect transistor forming region are respectively brought to about 2.0E17 [atoms/cm$^3$]. Further, the thickness of the semiconductor layer 20C is 50 [nm]. Therefore, the field effect transistors Qn and Qp are respectively activated as a complete depletion type. A process up to now is shown in FIG. 10(D).

Next, as shown in FIG. 10(E), a W/TiN film 26 is formed on the entire surface of the semiconductor base 20 including the upper part of the polycrystalline silicon film 23. The W/TiN film 26 is formed by forming a TiN film having about 10 [nm] by a reactive sputtering method and thereafter forming a film having about 50 [nm] by a sputtering method. The W/TiN film 26 is formed to achieve a reduction in the resistance of each gate electrode.

Next, the W/TiN film 26 and the polycrystalline silicon film 23 are respectively successively subjected to patterning to thereby form gate electrodes 27 on the n channel conduction type field effect transistor forming region and p channel conduction type field effect transistor forming region of the semiconductor layer 20C. This patterning is carried out with a photoresist film as a mask.

Next, phosphorous is selectively introduced into an n channel conduction type field effect transistor forming region of the p type semiconductor region 25A and a body electrode forming region of the n type semiconductor region 25B as the impurity by ion implantation to thereby form a pair of n type semiconductor regions 28 corresponding to source and drain regions and an n type semiconductor region 29 corresponding to a body electrode. The introduction of phosphorous is carried out under the condition that the final introduced amount thereof is about 1.5E15 [atoms/cm$^2$] and the amount of energy at its introduction is about 20 [Kev]. The introduction of phosphorous is performed with a photoresist film as a mask.

Next, boron is selectively introduced into a p channel conduction type field effect transistor forming region of the n type semiconductor region 25B and a body electrode forming region of the p type semiconductor region 25A as the impurity by ion implantation to thereby form a pair of p type semiconductor regions 30 corresponding to source and drain regions and a p type semiconductor region 31 corresponding to a body electrode. The introduction of boron is carried out under the condition that the final introduced amount thereof is about 1.5E15 [atoms/cm$^2$] and the amount of energy at its introduction is about 7 [Kev]. The introduction of phosphorous is performed with a photoresist film as a mask.

Next, a heat treatment is effected for 10 [seconds] at 950 [°C.] to activate the pair of n type semiconductor regions 28, the n-type semiconductor region 29, the pair of p type semiconductor regions 30 and the p type semiconductor region 31. A process up to now is shown in FIG. 10(F).

Next, an interlayer dielectric 32 is formed on the entire surface of the semiconductor base 20 and thereafter connecting holes are defined. Afterwards, wires or interconnections 33A, 33B, 33C, 33D and 33E are respectively formed, whereby the state illustrated in FIG. 8 is reached.

Thus, the present embodiment is provided with the body electrode comprised of the p type semiconductor region 31 electrically connected to the channel forming region of the n channel conduction type field effect transistor Qn, the back gate electrode comprised of the p type semiconductor region 24A provided below the insulating layer 20B and opposed to the channel forming region of the n channel conduction type field effect transistor Qn, the body electrode comprised of the n type semiconductor region 29 electrically connected to the channel forming region of the p channel conduction type field effect transistor Qp, and the back gate electrode comprised of the n type semiconductor region 24B provided below the insulating layer 20B as opposed to the channel forming region of the p channel conduction type field effect transistor Qp. Therefore, when a potential is applied to each of the body electrode and back gate electrode, the withstand voltages for the drains of the n channel conduction type field effect transistor Qn and the p channel conduction type field effect transistor Qp can be increased, and the stabilization of the respective threshold voltages (Vth) of the n channel conduction type field effect transistor Qn and the p channel conduction type field effect transistor Qp can be achieved.

Further, since the withstand voltages for the drains of the n channel conduction type field effect transistor Qn and p channel conduction type field effect transistor Qp can be set high, high-voltage aging can be carried out. The aging is done in a state in which the potential is applied to the back gate electrode or the back gate electrode and body electrode.

Since carriers of conduction type opposite to a channel formed in an upper portion of the channel forming region are drained by the body electrode comprised of the p type semiconductor region 31, the threshold voltage (Vth) of the field effect transistor Qn can be varied in a stable state according to the potential applied to the back gate electrode comprised of the p type semiconductor region 24A. Further, since the carriers of a conduction type opposite to that of the channel formed in the upper portion of the channel forming region are drawn or drained by the body electrode comprised of the n type semiconductor region 29, the threshold voltage (Vth) of the field effect transistor Qp can be changed in a stable state according to the potential applied to the back gate electrode comprised of the n type semiconductor region 24B.

Since the respective threshold voltages of the n channel conduction type field effect transistor Qn and p channel conduction type field effect transistor Qp can be changed in the stable state, a leakage current test at standby can be carried out. Lowering the threshold voltages (Vth) of the n channel conduction type field effect transistor Qn and p channel conduction type field effect transistor Qp upon operation allows a high-speed operation. The leakage current test is carried out in a state in which the potential has been applied to the back gate electrode or the back gate electrode and body electrode, in such a manner that the threshold voltage of the field effect transistor is increased.

Further, the potential applied to the back gate electrode or the back gate electrode and body electrode can be changed with time so as to vary the characteristics of the field effect transistor Qn and the field effect transistor Qp.

Figure 16:
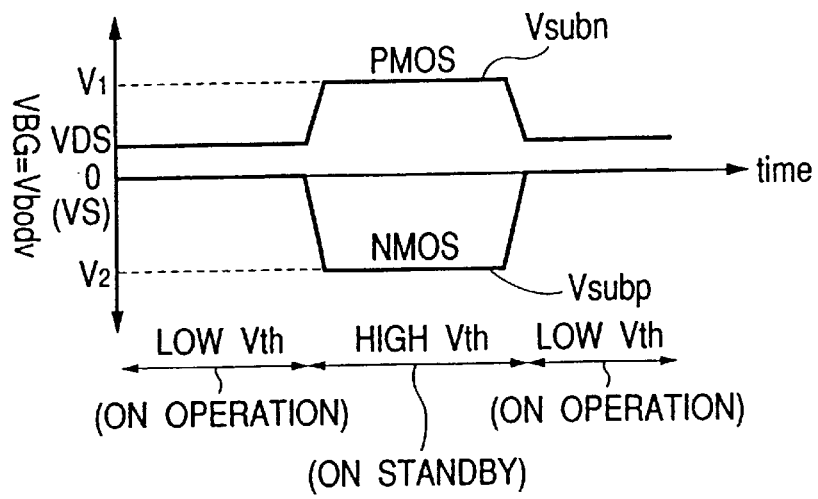
FIG. 16 is a timing chart.

As shown in FIG. 16 (timing chart), $V_1$=Vsubn potential (>VDS potential) is applied to the body electrode and back gate electrode of PMOS (p channel conduction type field effect transistor Qp) and $V_2$=Vsubp potential (<VS potential) is applied to the body electrode and back gate electrode of NMOS (n channel conduction type field effect transistor Qn) upon standby. Consequently, Vth (threshold voltages) of PMOS and NMOS can be rendered high and hence leak current can be reduced. Further, a normal operation can be carried out by making Vsubn potential=VDS potential and Vsubp potential=VS potential (0[V] potential) upon operation.

Embodiment 4

In the present embodiment, an example in which the present invention is applied to a semiconductor device having a complete depletion type field effect transistor, will be described.

Figure 11:
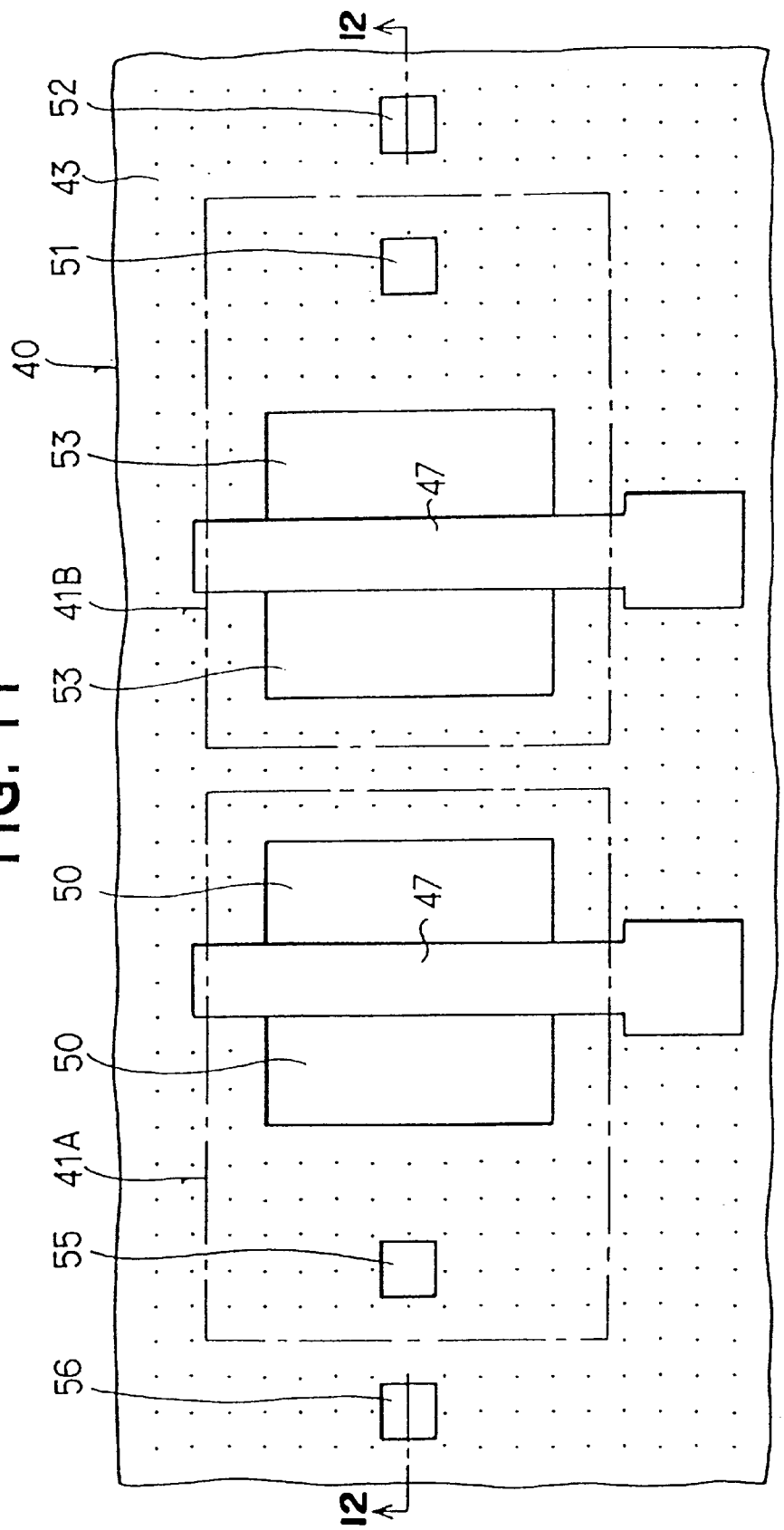
FIG. 11 is a fragmentary plan view of a semiconductor device showing an embodiment 4 of the present invention.
Figure 12:
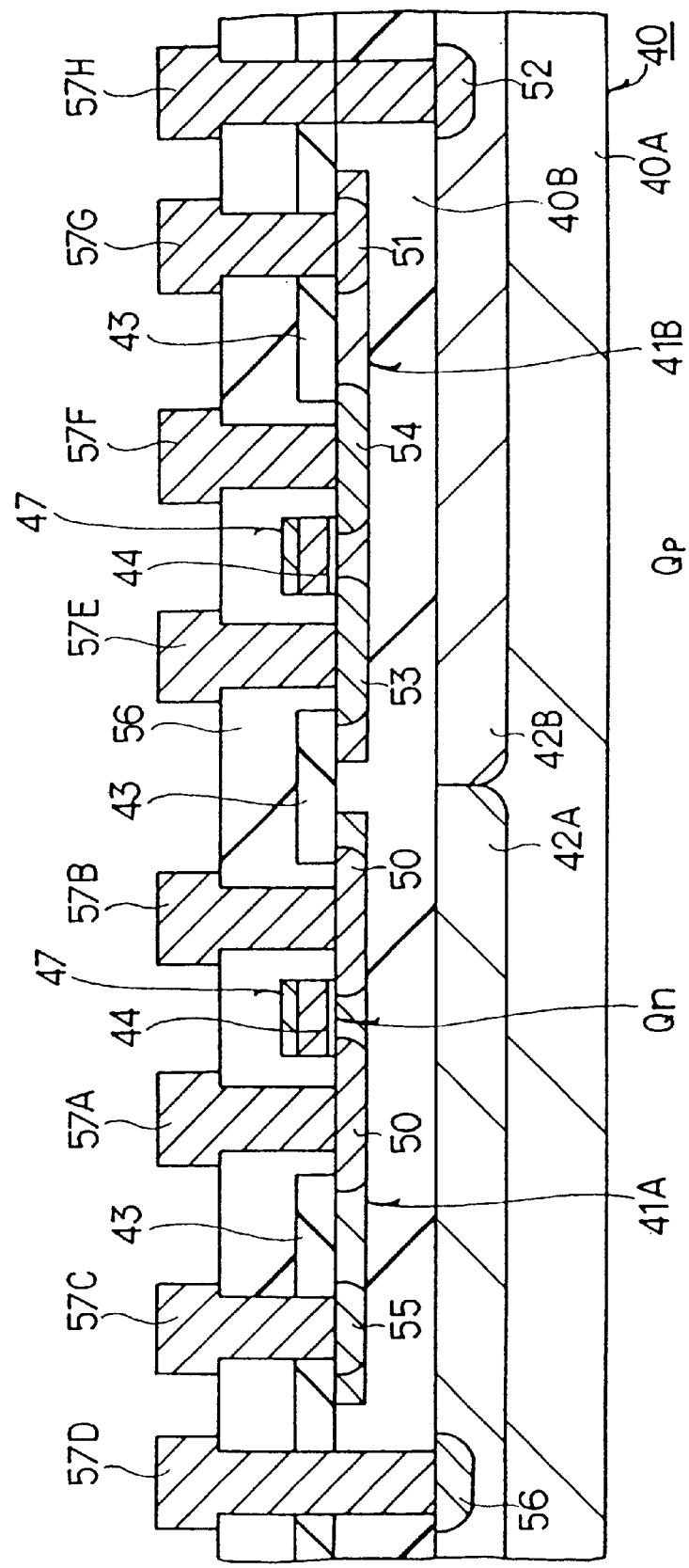
FIG. 12 is a fragmentary cross-sectional view cut in a position taken along line F—F in FIG. 11.

FIG. 11 is a fragmentary plan view of the semiconductor device showing the embodiment 4 of the present invention. FIG. 12 is a cross-sectional view cut in a position taken along line F—F shown in FIG. 11. Incidentally, an illustration of each layer above a gate electrode 47 to be described later is omitted in FIG. 11 to make it easy to understand the drawing. Further, an illustration of each layer above an interconnection 57A to be described later is omitted in FIG. 12 to make it easy to understand the drawing.

As shown in FIGS. 11 and 12, the semiconductor device according to the present embodiment has a p type semiconductor layer 41A and an n type semiconductor layer 41B insulated and separated from each other by an insulating layer 40B. Further, a complete depletion type n channel conduction type p field effect transistor Qn is formed in the p type semiconductor layer 41A, and a complete depletion type p channel conduction type field effect transistor Qp is formed in the n type semiconductor layer 41B. Further, the semiconductor device according to the present embodiment is constructed so that potentials can be respectively independently applied to a p type semiconductor region 55 used as a body electrode and a p type semiconductor region 42A used as a back gate electrode. Furthermore, the semiconductor device is constructed in such a manner that potentials can be respectively independently applied to an n type semiconductor region 51 used as a body electrode and an n type semiconductor region 42B used as a back gate electrode.

A method of manufacturing the semiconductor device will be explained below with reference to FIGS. 13(A) through 13(J) (fragmentary cross-sectional views for describing the manufacturing method).

Figure 13A:
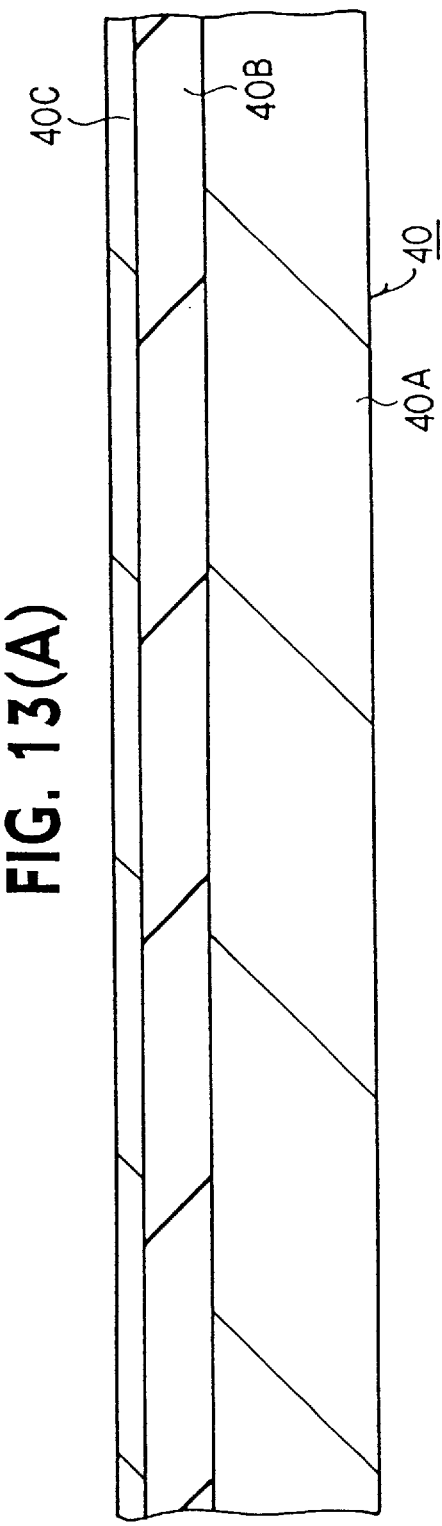

As shown in FIG. 13(A), a semiconductor base 20 having an SOI structure provided with an insulating layer 40B composed of a silicon oxide film between a p type semiconductor substrate 40A composed of monocrystal silicon and a semiconductor layer 40C composed of monocrystal silicon is first prepared. The p type semiconductor substrate 40A is set to an impurity concentration of about 1.3E15 [atoms/cm$^3$]. The insulating layer 40B is set to a thickness of about 100 [nm]. The semiconductor layer 40C is set to a thickness of about 50 [nm] and is not doped with an impurity.

Next, a thermal oxidation silicon film having a thickness of about 10 [nm], is formed on the surface of the semiconductor layer 40C. Thereafter, a silicon nitride film having a thickness of about 30 [nm] is formed on the surface of the thermal oxidation silicon film and is thereafter subjected to patterning to thereby form individually separated masks M on an n channel conduction type field effect transistor forming region and a p channel conduction type field effect transistor forming region of the semiconductor layer 40C.

Figure 13B:
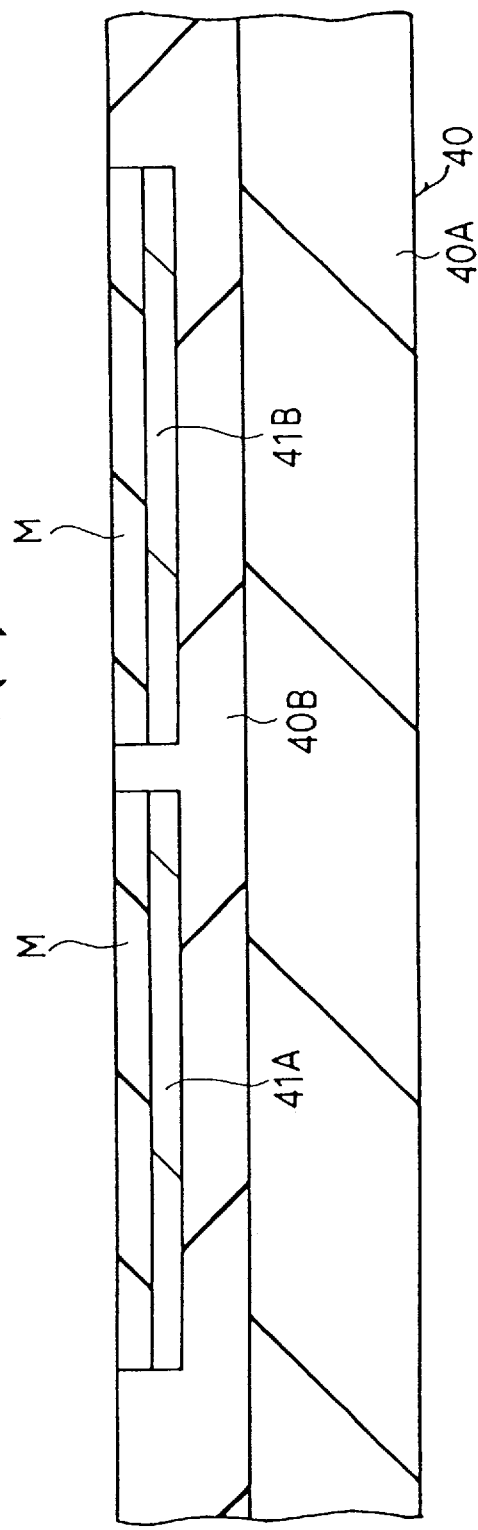

Next, a thermal oxidation process is performed to oxidize portions of the semiconductor layer 40C exposed from the masks M, thereby forming a semiconductor layer 41A and a semiconductor layer 41B insulated and separated from each other. A process up to now is shown in FIG. 13(B).

Next, a wet etching process using an aqueous solution of hydrofluoric acid is performed and thereafter a wet etching process using a hot phosphoric acid solution is effected to remove the masks M. Afterwards, boron (B) is selectively introduced into the semiconductor layer 41A as an impurity by ion implantation to thereby form a p type semiconductor layer 41A having an impurity concentration of about 2E17 [atoms/cm$^3$]. The introduction of boron is carried out under the condition that the final introduced amount thereof is about 1E12 [atoms/cm$^2$] and the amount of energy at its introduction is about 10 [Kev]. The introduction of boron is performed with a photoresist film as a mask.

Next, boron is selectively introduced into a principal surface of the semiconductor substrate 40A opposite to the p type semiconductor layer 41A as the impurity by ion implantation to thereby form a p type semiconductor region 42A used as a back gate electrode. The introduction of boron is carried out under the condition that the final introduced amount thereof is about 1E13 [atoms/cm$^2$] and the amount of energy at its introduction is about 100 [Kev]. The introduction of boron is performed with a photoresist film as a mask.

Next, phosphorous is selectively introduced into the semiconductor layer 41B as an impurity by ion implantation to thereby form an n type semiconductor layer 41B having an impurity concentration of about 2E17 [atoms/cm$^3$]. The introduction of phosphorous is performed under the condition that the final introduced amount thereof is about 1E12 [atoms/cm$^2$] and the amount of energy at its introduction is about 25 [Kev]. The introduction of phosphorous is done with a photoresist film as a mask.

Next, phosphorous is selectively introduced into the principal surface of the semiconductor substrate 40A opposite to the n type semiconductor layer 41B as the impurity by ion implantation to thereby form an n type semiconductor region 42B used as a back gate electrode. The introduction of phosphorous is carried out under the condition that the final introduced amount thereof is about 1E13 [atoms/cm$^2$] and the amount of energy at its introduction is about 240 [Kev]. The introduction of phosphorous is performed with a photoresist film as a mask. A process up to now is shown in FIG. 13(C).

Next, as shown in FIG. 13(D), a field insulating film 43 composed of a silicon oxide film having a thickness of about 100 [nm] is formed on the entire surface of the semiconductor base 40 including the upper part of the p type semiconductor layer 41A and n type semiconductor layer 41B. Thereafter, the field insulating film 43 is subjected to patterning to thereby define or open an element forming region and a body electrode forming region of the p type semiconductor layer 41A and an element forming region, a body electrode forming region and a feeding region of the n type semiconductor layer 41B as shown in FIG. 13(E). The patterning of the filed insulating film 43 is carried out with a photoresist film as a mask.

Next, a thermal oxidation process is performed to form a gate insulator 44 composed of a thermal oxidation silicon film having a thickness of about 3.5 [nm] on the element forming regions of the p type semiconductor layer 41A and n type semiconductor layer 41B. The thermal oxidation process is carried out in an atmosphere of partial-pressure steam at 900 [°C.].

Next, as shown in FIG. 13(F), a polycrystalline silicon film 45 having a thickness of about 100 [nm] is formed on the entire surface of the semiconductor base 40 including the upper part of the gate insulator 44 by a CVD method.

Next, phosphorous is selectively introduced into the polycrystalline silicon film 45 opposite to the p type semiconductor layer 41A as the impurity by ion implantation. Thereafter, boron is selectively introduced into the polycrystalline silicon film 45 opposite to the n type semiconductor layer 41B as the impurity by ion implantation. The introduction of phosphorous is carried out under the condition that the final introduced amount thereof is about 1.5E15 [atoms/cm$^2$] and the amount of energy at its introduction is about 15 [Kev]. The introduction of boron is carried out under the condition that the final introduced amount thereof is about 1.5E15 [atoms/cm$^2$] and the amount of energy at its introduction is about 5 [Kev]. The introduction of phosphorous is performed for the purpose of bringing the gate electrode of the n channel conduction type field effect transistor into an n type, whereas the introduction of boron is carried out for the purpose of bringing the gate electrode of the p channel conduction type field effect transistor into a p type.

Next, a CMP (Chemical Mechanical Polishing) method is used to remove the polycrystalline silicon film 45 provided on the field insulating film 43.

Figure 13G:
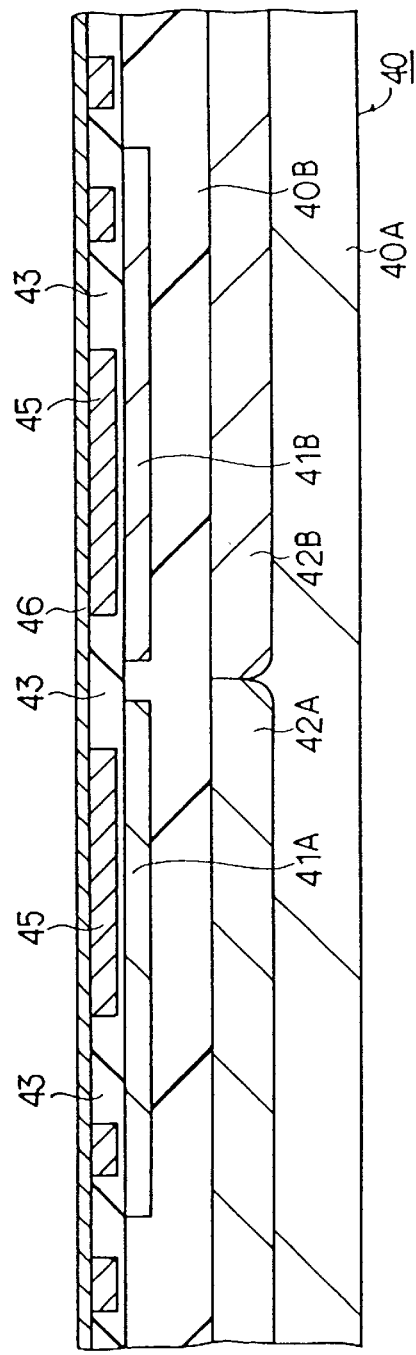

Next, as shown in FIG. 13(G), a W/TiN film 46 is formed on the entire surface of the semiconductor base 40 including the upper part of the polycrystalline silicon film 45. The W/TiN film 46 is formed by forming a TiN film having about 10 [nm] by a reactive sputtering method and thereafter forming a W film having about 50 [nm] by a sputtering method. The W/TiN film 46 is formed to achieve a reduction in the resistance of each gate electrode.

Figure 13H:
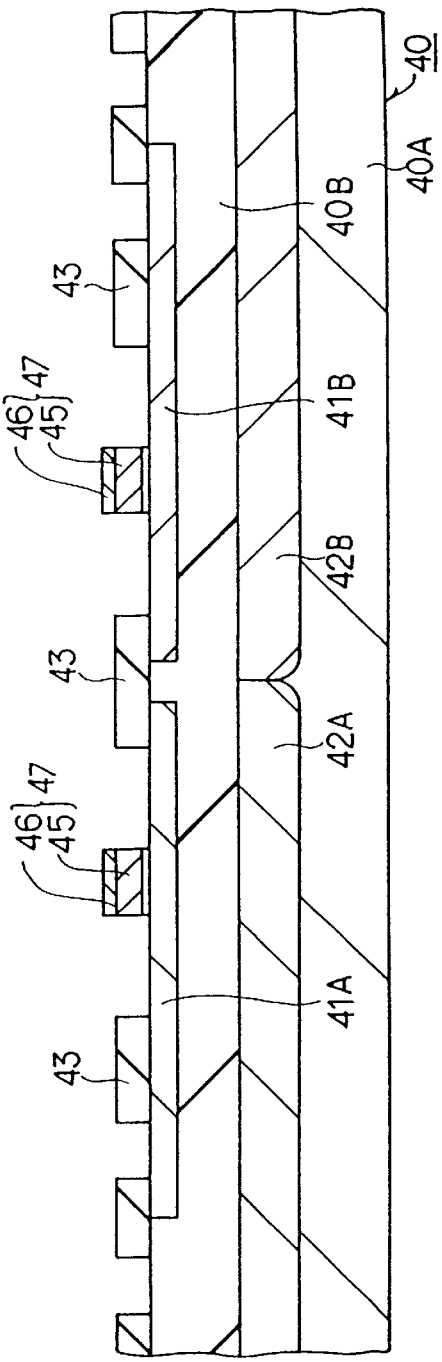

Next, the W/TiN film 46 and the polycrystalline silicon film 45 are respectively successively subjected to patterning to thereby form gate electrodes 47 on the element forming region of the p type semiconductor layer 41A and the element forming region of the n type semiconductor layer 41B as shown in FIG. 13(H). This patterning is carried out with a photoresist film as a mask.

Next, a first connecting hole for exposing the surface of part of the p type semiconductor region 42A, and a second connecting hole for exposing the surface of part of the n type semiconductor region 42B are respectively defined.

Next, a buffer insulating film composed of a silicon oxide film having a thickness of about 5 [nm] is formed on the entire surface of the semiconductor base 40 by the CVD method.

Next, phosphorous is selectively introduced into the element forming region of the p type semiconductor layer 41A, the body electrode forming region of the n type semiconductor layer 41B and the n type semiconductor region 42B exposed from the second connecting hole as the impurity by ion implantation to thereby form a pair of n type semiconductor regions 50 corresponding to source and drain regions, an n type semiconductor region 51 corresponding to a body electrode, and an n type semiconductor region 52 corresponding to a contact region. The introduction of phosphorous is carried out under the condition that the final introduced amount thereof is about 1.5E15 [atoms/cm$^2$] and the amount of energy at its introduction is about 20 [Kev]. The introduction of phosphorous is performed with a photoresist film as a mask.

Figure 13I:
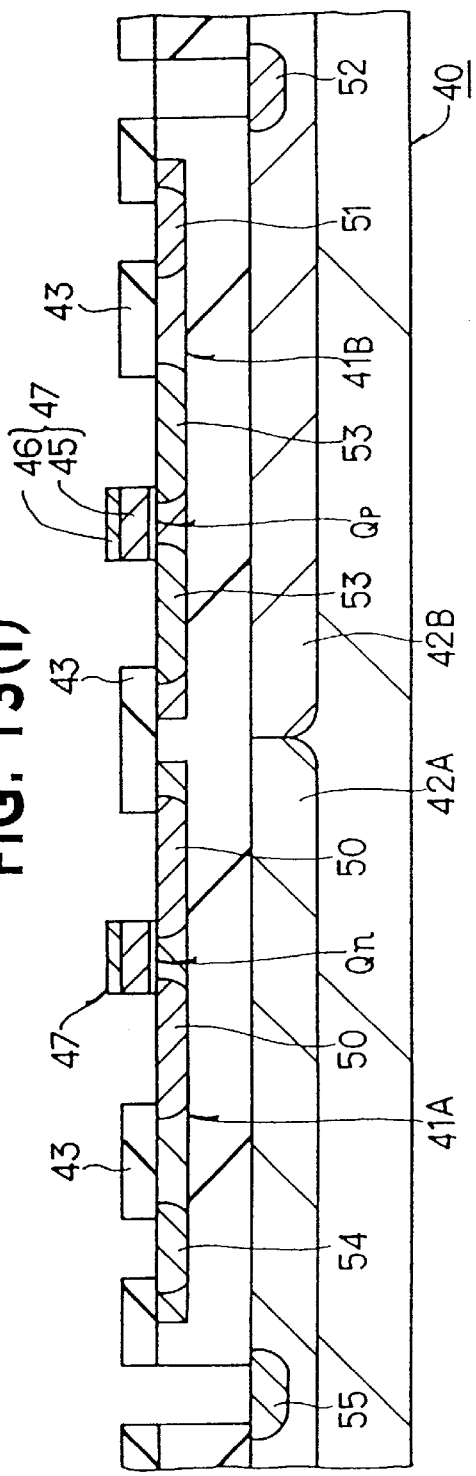

Next, boron is selectively introduced into the element forming region of the n type semiconductor layer 41B, the body electrode forming region of the p type semiconductor layer 41A and the p type semiconductor region 42A exposed from the first connecting hole as the impurity by ion implantation to thereby form a pair of p type semiconductor regions 53 corresponding to source and drain regions, a p type semiconductor region 54 corresponding to a body electrode, and a p type semiconductor region 55 corresponding to a contact region. The introduction of boron is carried out under the condition that the final introduced amount thereof is about 1.5E15 [atoms/cm$^2$] and the amount of energy at its introduction is about 5 [Kev]. The introduction of phosphorous is performed with a photoresist film as a mask. A process up to now is illustrated in FIG. 13(I).

Figure 13J:
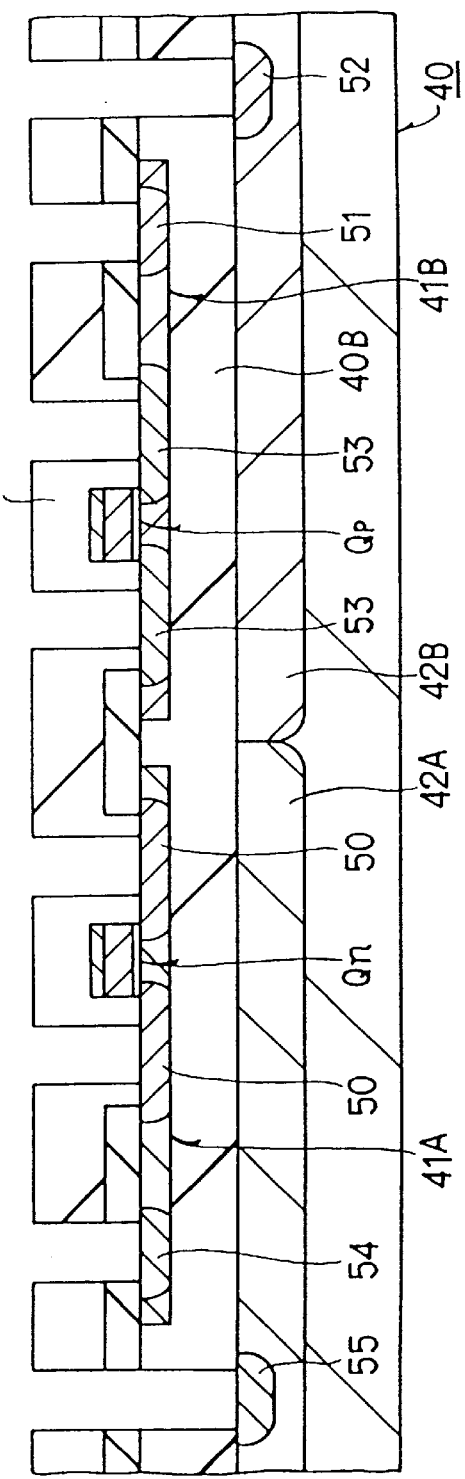

Next, an interlayer dielectric 56 is formed on the entire surface of the semiconductor base 40. Thereafter, connecting holes are defined as shown in FIG. 13(J). Afterwards, wires or interconnections 57A through 57H are formed. Consequently, the state shown in FIG. 12 is reached.

In a manner similar to the aforementioned embodiment 3, the semiconductor device according to the present embodiment as described above is provided with the body electrode comprised of the p type semiconductor region 55 electrically connected to the channel forming region of the n channel conduction type field effect transistor Qn, the back gate electrode comprised of the p type semiconductor region 42A provided below the insulating layer 40B and opposed to the channel forming region of the n channel conduction type field effect transistor Qn, the body electrode comprised of the n type semiconductor region 51 electrically connected to the channel forming region of the p channel conduction type field effect transistor Qp, and the back gate electrode comprised of the n type semiconductor region 42B provided below the insulating layer 40B and opposed to the channel forming region of the p channel conduction type field effect transistor Qp. Therefore, the semiconductor device can obtain an effect similar to that obtained by the aforementioned embodiment 3. Further, the potentials can be respectively independently applied to the body electrode and back gate electrode.

Figure 17:
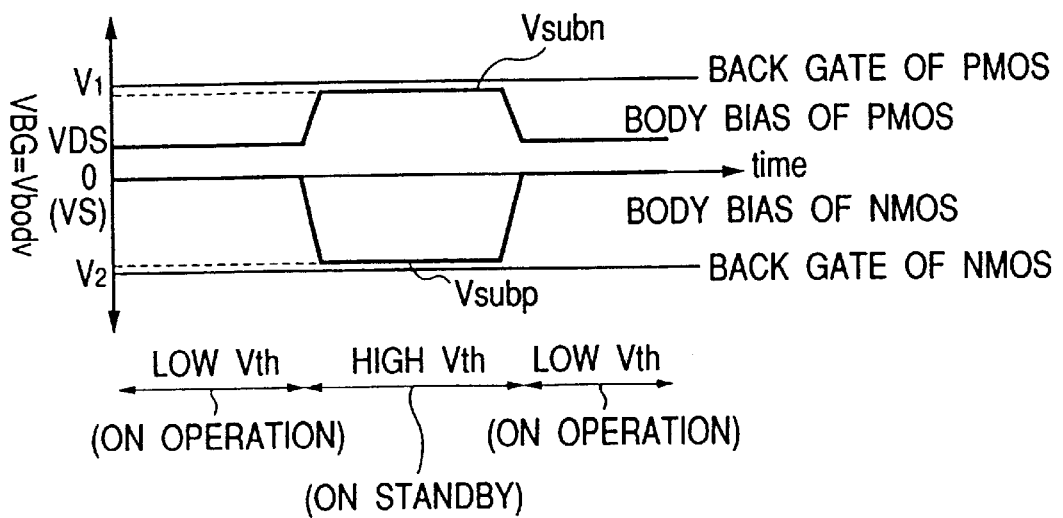
FIG. 17 is a timing chart.

As shown in FIG. 17 (timing chart), Vsubn potential $V_1$=potential (>VDS potential) and Vsubp potential=$V_2$ potential (<VS potential) are applied in a manner similar to the embodiment 3, so that Vth (threshold voltages) of PMOS (p channel conduction type field effect transistor Qp) and NMOS (n channel conduction type field effect transistor Qn) can be rendered high and hence the leakage current can be reduced.

Embodiment 5

In the present embodiment, an example in which the present invention is applied to a semiconductor device having a complete depletion type field effect transistor, will be described.

Figure 14:
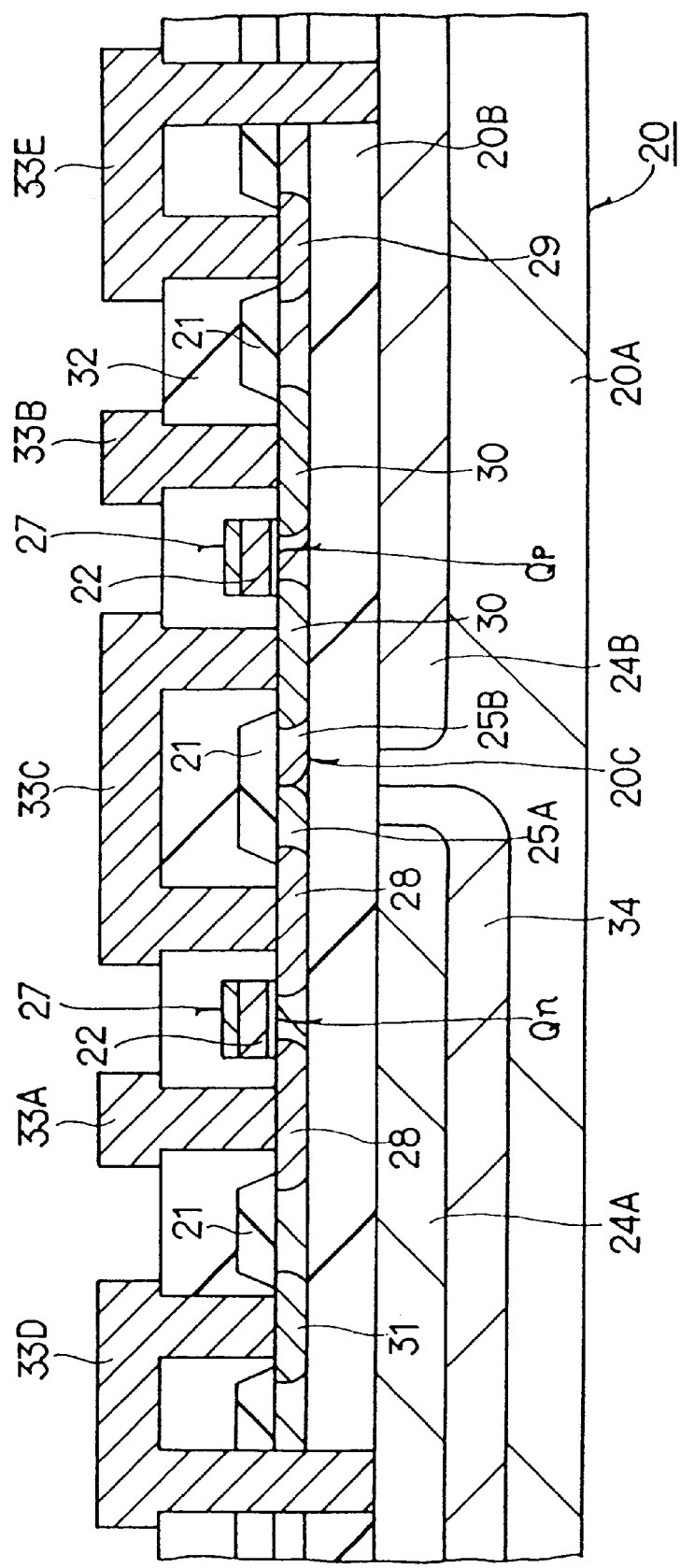
FIG. 14 is a fragmentary cross-sectional view of a semiconductor device showing an embodiment 5 of the present invention.

FIG. 14 is a fragmentary cross-sectional view of the semiconductor device showing the embodiment 5 of the present invention.

As shown in FIG. 14, the semiconductor device according to the present embodiment is substantially identical in structure to the aforementioned embodiment 3. The present embodiment is different from the aforementioned embodiments in that a p type semiconductor region 24A used as a back gate electrode is electrically isolated from a p type semiconductor substrate 20A by an n type semiconductor region 34. The p type semiconductor region 24A is provided in a principal surface of the n type semiconductor region 34, and the n type semiconductor region 34 is provided in a principal surface of the p type semiconductor substrate 20A.

Owing to the electrical separation of the p type semiconductor region 24A used as the back gate electrode from the p type semiconductor substrate 20A by the n type semiconductor region 34 in this way, a back gate potential of a specific circuit block can be changed to a back gate potential of another circuit block.

Further, since the back gate potential of the specific circuit block and the back gate potential of another circuit block can be changed to each other, an n channel conduction type field effect transistor and a p channel conduction type field effect transistor constituting the specific circuit block are respectively brought to a high threshold voltage to achieve a low power consumption. Further, an n channel conduction type field effect transistor and a p channel conduction type field effect transistor constituting another circuit block are respectively brought to a low threshold voltage so that they can be activated at high speed.

Embodiment 6

Figure 15A:
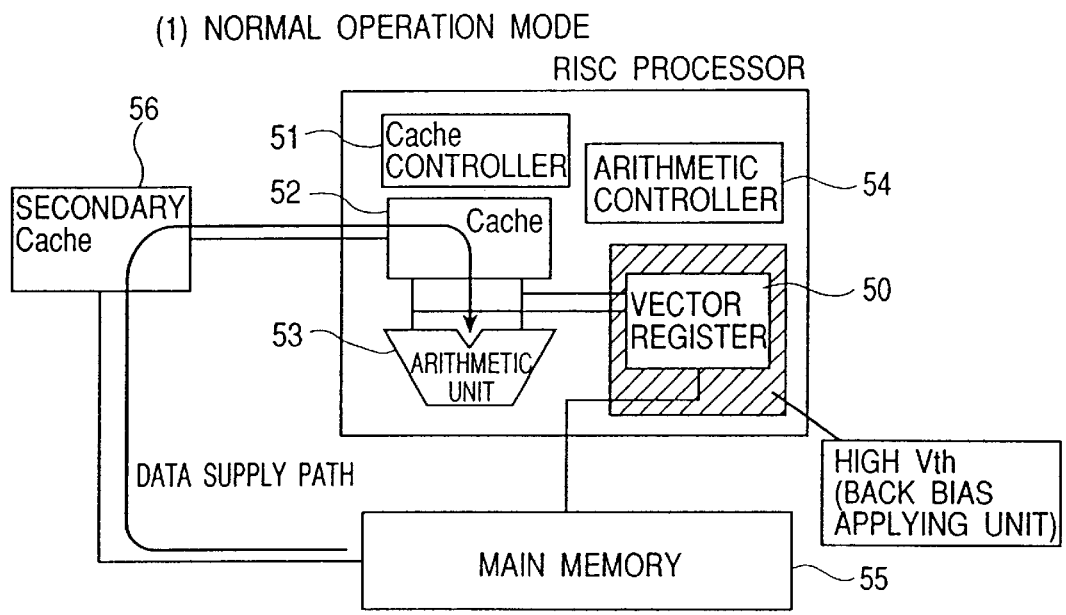
FIGS. 15(A) and 15(B) are block diagrams showing operation modes of a RISC processor (semiconductor device) illustrative of an embodiment 6 of the present invention.
Figure 15B:
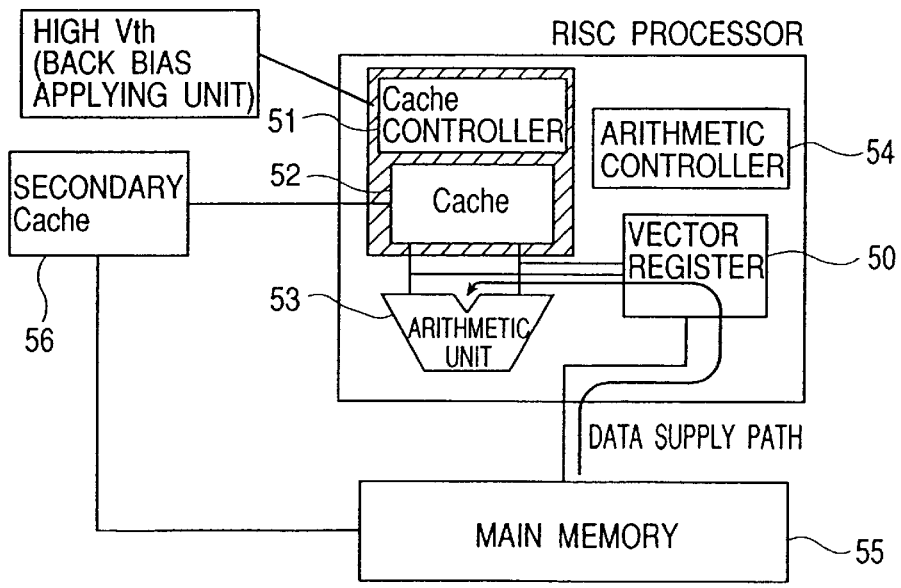

FIGS. 15(A) and 15(B) are block diagrams showing operation modes of a RISC processor (semiconductor device) illustrative of an embodiment 6 of the present invention. In the drawing, reference numeral 50 indicates a vector register, reference numeral 51 indicates a cache controller, reference numeral 52 indicates a cache unit, reference numeral 53 indicates an arithmetic unit, reference numeral 54 indicates an arithmetic controller, reference numeral 55 indicates a main memory, and reference numeral 56 indicates a secondary cache.

As shown in FIGS. 15(A) and 15(B), a field effect transistor of the vector register 50 unused in a normal operation mode (1) is brought to a high Vth (high threshold), based on a back gate potential. Further, field effect transistors of the cache controller 51 and cache unit 52 unused in a vector compute mode are respectively brought to a high Vth (high threshold), based on a back gate potential, i.e., the unused portions are brought to the high Vth, whereby low power consumption of the RISC processor can be achieved.

The invention, which has been achieved by the present inventors, has been described specifically by the aforementioned embodiments. However, the present invention is not necessarily limited to the embodiments. It is needless to say that various changes can be made thereto within the scope not departing from the substance thereof.

Effects obtained by typical ones of the inventions disclosed in the present application will be described in brief as follows:

A withstand voltage for a drain of a field effect transistor formed in a semiconductor layer provided on an insulating layer can be increased.

The stabilization of a threshold voltage of a field effect transistor formed in a semiconductor layer provided on an insulating layer can be achieved.

A threshold voltage of a field effect transistor formed in a semiconductor layer provided on an insulating layer can be changed in a stable state.

High-voltage aging can be carried out in a semiconductor device having a field effect transistors formed in a semiconductor layer provided on an insulating layer.

A leakage current test for each field effect transistor formed in a semiconductor layer provided on an insulating layer can be carried out.

What is claimed is:

1. A semiconductor device comprising:
   a semiconductor base including a substrate, an insulating layer formed on said substrate, and a semiconductor layer formed on said insulating layer; and
   a field effect transistor including a source, a drain, and a channel forming region formed in said semiconductor layer, said source and drain region having a first conductivity type, and said channel forming region having a second conductivity type opposite to said first conductivity type;
   a gate insulating film of said field effect transistor formed on said semiconductor layer,
   a gate electrode of said field effect transistor formed on said gate insulating film,
   a body electrode including a semiconductor region of said second conductivity type formed in said semiconductor layer and electrically connected to said channel forming region of said field effect transistor, and
   a back gate electrode provided below said insulating layer opposed to said channel forming region of said field effect transistor such that said channel forming region is arranged between said back gate electrode and said gate electrode of said field effect transistor.

2. A semiconductor device comprising:

a field effect transistor formed in a semiconductor layer provided on an insulating layer;

a source, a drain, and a channel forming region of said field effect transistor each formed in said semiconductor layer;

a gate insulating film of said field effect transistor formed on said semiconductor layer;

a gate electrode of said field effect transistor formed on said gate insulating film;

a body electrode electrically connected to said channel forming region of said field effect transistor; and a back gate electrode provided below said insulating layer opposed to said channel forming region of said field effect transistor such that said channel forming region is arranged between said back gate electrode and said gate electrode of said field effect transistor, wherein potentials are independently applied to said gate electrode, said source region, said drain region, said back gate electrode, and said body electrode, respectively.

3. A semiconductor device comprising:

a semiconductor base including a substrate, an insulating layer formed on said substrate, and a semiconductor layer formed on said insulating layer;

a field effect transistor including a source, a drain, and a channel forming region formed in said semiconductor layer, said source and drain region of said field effect transistor having a first conductivity type, and said channel forming region having a second conductivity type opposite to said first conductivity type;

a gate insulating film of said field effect transistor formed on said semiconductor layer;

a gate electrode of said field effect transistor formed on said gate insulating film;

a body electrode including a semiconductor region of said second conductivity type formed in said semiconductor layer and electrically connected to said channel forming region of said field effect transistor; and a back gate electrode provided below said insulating layer and in said substrate such that said channel forming region is arranged between said back gate electrode and said gate electrode of said field effect transistor, wherein an impurity concentration of said semiconductor region is greater than an impurity concentration of said channel forming region of said field effect transistor, wherein said back gate electrode extends under said semiconductor region and said channel forming region of said field effect transistor, and wherein potentials are independently applied to said gate electrode, said source region, said drain region, said back gate electrode, and said body electrode, respectively.

4. A semiconductor device according to claim 1, wherein potentials are applied to said back gate electrode and said body electrode to control carriers of said second conductivity type such that said carriers flow into said semiconductor region.

5. A semiconductor device according to claim 1, wherein potentials are applied to said back gate electrode and said body electrode to induce carriers of said second conductivity type in a region of said semiconductor layer contacting said insulating layer.

6. A semiconductor device comprising:

a semiconductor base including a substrate, an insulating layer formed on said substrate, and a semiconductor layer formed on said insulating layer;

a n-channel field effect transistor including a source, a drain, and a channel forming region formed in a first portion of said semiconductor layer, said source and drain region having n-type conductivity, and said channel forming region having p-type conductivity;

a first gate insulating film of said n-channel field effect transistor formed on said first portion;

a first gate electrode of said n-channel field effect transistor formed on said first gate insulating film;

a first body electrode including a first semiconductor region of p-type conductivity formed in said first portion and electrically connected to paid channel forming region of said n-channel field effect transistor;

a first back gate electrode provided below said insulating layer opposed to said channel forming region of said n-channel field effect transistor such that said channel forming region is arranged between said first back gate electrode and said first gate electrode of said n-channel field effect transistor, wherein an impurity concentration of said first semiconductor region is greater than an impurity concentration of said channel forming region of said n-channel field effect transistor, and wherein said first back gate electrode extends under said first semiconductor region and said channel forming region of said n-channel field effect transistor;

a p-channel field effect transistor including a source, a drain, and a channel forming region formed in a second portion of said semiconductor layer, said source and drain region having p-type conductivity, said channel forming region having n-type conductivity;

a second gate insulating film of said p-channel field effect transistor formed on said second portion;

a second gate electrode of said p-channel field effect transistor formed on said second gate insulating film, a second body electrode including a second semiconductor region of n-type conductivity formed in said second portion and electrically connected to said channel forming region of said p-channel field effect transistor; and a second back gate electrode provided below said insulating layer opposed to said channel forming region of said p-channel field effect transistor such that said channel forming region is arranged between said second back gate electrode and said second gate electrode of said p-channel field effect transistor, wherein an impurity concentration of said second semiconductor region is greater than an impurity concentration of said channel forming region of said p-channel field effect transistor, and wherein said second back gate electrode extends under said second semiconductor region and said channel forming region of said p-channel field effect transistor.

7. A semiconductor device comprising:

a n-channel field effect transistor formed in a first semiconductor layer provided on an insulating layer;

a source, a drain, and a channel forming region of said n-channel field effect transistor each formed in said semiconductor layer;

a first gate insulating film of said n-channel field effect transistor formed on said first semiconductor layer;

a first gate electrode of said n-channel field effect transistor formed on said first gate insulating film;
a first body electrode electrically connected to said channel forming region of said n-channel field effect transistor;
a first back gate electrode provided below said insulating layer opposed to said channel forming region of said n-channel field effect transistor such that said channel forming region is arranged between said first back gate electrode and said first gate electrode of said n-channel field effect transistor,
  wherein potentials are independently applied to said first gate electrode, said source region, said drain region, said first back gate electrode, and said first body electrode, respectively;
a p-channel field effect transistor formed in a second semiconductor layer provided on said insulating layer;
a source, a drain, and a channel forming region of said p-channel field effect transistor each formed in said second semiconductor layer;
a second gate insulating film of said p-channel field effect transistor formed on said second semiconductor layer;
a second gate electrode of said p-channel field effect transistor formed on said second gate insulating film;
a second body electrode electrically connected to said channel forming region of said p-channel field effect transistor; and
a second back gate electrode provided below said insulating layer opposed to said channel forming region of said p-channel field effect transistor such that said channel forming region is arranged between said second back gate electrode and said second gate electrode of said p-channel field effect transistor,
  wherein potentials are independently applied to said second gate electrode, said source region, said drain region, said second back gate electrode, and said second body electrode, respectively.

8. A semiconductor device comprising:
a semiconductor base including a substrate, an insulating layer formed on said substrate, and a semiconductor layer formed on said insulating layer;
a n-channel field effect transistor including a source, a drain, and a channel forming region formed in a first portion of said semiconductor layer, said source and drain region having n-type conductivity, and said channel forming region having p-type conductivity;
a first gate insulating film of said n-channel field effect transistor formed on said first portion;
a first gate electrode of said n-channel field effect transistor formed on said first gate insulating film;
a first body electrode including a first semiconductor region of said p-type conductivity formed in said first portion and electrically connected to said channel forming region of said n-channel field effect transistor,
a first back gate electrode provided below said insulating layer opposed to said channel forming region of said n-channel field effect transistor such that said channel forming region is arranged between said first back gate electrode and said first gate electrode of said n-channel field effect transistor,
  wherein an impurity concentration of said first semiconductor region is greater than an impurity concentration of said channel forming region of said n-channel field effect transistor,
  wherein said first back gate electrode extends under said first semiconductor region and said channel forming region of said n-channel field effect transistor, and
  wherein potentials are applied to said first back gate electrode and said first body electrode so as to induce a channel of p-type conductivity in said first semiconductor layer contacting said insulating layer such that said channel contacts said first semiconductor region and so as to control holes such that said holes flow into said first semiconductor region through said channel;
a p-channel field effect transistor including a source, a drain, and a channel forming region formed in a second portion of said semiconductor layer, said source and drain region having p-type conductivity, and said channel forming region having n-type conductivity;
a second gate insulating film of said p-channel field effect transistor formed on said second portion;
a second gate electrode of said p-channel field effect transistor formed on said second gate insulating film;
a second body electrode including a second semiconductor region of said n-type conductivity formed in said second portion and electrically connected to said channel forming region of said p-channel field effect transistor, and
a second back gate electrode provided below said insulating layer opposed to said channel forming region of said p-channel field effect transistor such that said channel forming region is arranged between said second back gate electrode and said second gate electrode of said p-channel field effect transistor,
  wherein an impurity concentration of said second semiconductor region is greater than an impurity concentration of said channel forming region of said p-channel field effect transistor,
  wherein said second back gate electrode extends under said second semiconductor region and said channel forming region of said p-channel field effect transistor, and
  wherein potentials are applied to said second back gate electrode and said second body electrode so as to induce a channel of n-type conductivity in said second semiconductor layer contacting said insulating layer such that said channel contacts said second semiconductor region and so as to control electrons such that said electrons flow into said second semiconductor region through said channel.

9. A semiconductor device according to claim 8, wherein said first back gate electrode and said second back gate electrode are electrically separated from each other in said substrate.

10. A semiconductor device according to claim 6, wherein said potentials are applied to said first back gate electrode and said first body electrode to induce carriers of p-type conductivity in said first portion contacting said insulating layer, and
  wherein said potentials are applied to said second back gate electrode and said second body electrode to induce carriers of n-type conductivity in said second portion contacting said insulating layer.

11. A semiconductor device according to claim 6, wherein said potentials are applied to said first back gate electrode and said first body electrode so as to induce carriers of p-type conductivity in said first portion contacting said insulating layer and so as to control said carriers such that said carriers flow into said first semiconductor region, and
  wherein said potentials are applied to said second back gate electrode and said second body electrode to induce carriers of n-type conductivity in said second portion contacting said insulating layer and so as to control said carriers such that said carriers flow into said second semiconductor region.

12. A semiconductor device according to claim 1, wherein an impurity concentration of said semiconductor region is greater than an impurity concentration of said channel forming region, and wherein said back gate electrode extends under said semiconductor region and said channel forming region of said field effect transistor.

13. A semiconductor device according to claim 1, wherein potentials are applied to said back gate electrode and said body electrode so as to induce a channel of said second conductivity in said semiconductor layer contacting said insulating layer such that said channel contacts said semiconductor region and so as to control carriers of said second conductivity such that said carriers flow into said semiconductor region through said channel.

14. A semiconductor device according to claim 2, wherein said potentials are applied to said back gate electrode and said body electrode so as to induce a channel of said second conductivity in said semiconductor layer contacting said insulating layer such that said channel contacts said semiconductor region and so as to control carriers of said second conductivity such that said carriers flow into said semiconductor region through said channel.

15. A semiconductor device according to claim 2, wherein said potentials are applied to said back gate electrode and said body electrode to control carriers of said second conductivity type such that said carriers flow into said semiconductor region.

16. A semiconductor device according to claim 2, wherein said potentials are applied to said back gate electrode and said body electrode to induce carriers of said second conductivity type in a region of said semiconductor layer contacting said insulating layer.

17. A semiconductor device according to claim 3, wherein said potentials are applied to said back gate electrode and said body electrode so as to induce a channel of said second conductivity in said semiconductor layer contacting said insulating layer such that said channel contacts said semiconductor region and so as to control carriers of said second conductivity such that said carriers flow into said semiconductor region through said channel.

18. A semiconductor device according to claim 17, wherein said potentials are applied to said back gate electrode and said body electrode to control carriers of said second conductivity type such that said carriers flow into said semiconductor region.

19. A semiconductor device according to claim 17, wherein said potentials are applied to said back gate electrode and said body electrode to induce carriers of said second conductivity type in a region of said semiconductor layer contacting said insulating layer.

20. A semiconductor device according to claim 6, wherein potentials are applied to said first back gate electrode and said first body electrode so as to induce a channel of p type conductivity in said first semiconductor layer contacting said insulating layer such that said channel contacts said first semiconductor region and so as to control holes such that said holes flow into said first semiconductor region through said channel, and wherein potentials are applied to said second back gate electrode and said second body electrode so as to induce a channel of n-type conductivity in said second semiconductor layer contacting said insulating layer such that said channel contacts said second semiconductor region and so as to control electrons such that said electrons flow into said second semiconductor region through said channel.

21. A semiconductor device according to claim 6, wherein potentials are applied to said first back gate electrode and said first body electrode to control holes such that said holes flow into said first semiconductor region, and wherein potentials are applied to said second back gate electrode and said second body electrode to control electrons such that said electrons flow into said second semiconductor region.

22. A semiconductor device according to claim 6, wherein potentials are applied to said first back gate electrode and said first body electrode to induce holes in a region of said first semiconductor layer contacting said insulating layer, and wherein potentials are applied to said second back gate electrode and said second body electrode to induce electrons in a region of said second semiconductor layer contacting said insulating layer.

23. A semiconductor device according to claim 7, wherein said potentials are applied to said first back gate electrode and said first body electrode so as to induce a channel of p-type conductivity in said first portion contacting said insulating layer such that said channel contacts said first semiconductor region and so as to control holes such that said holes flow into said first semiconductor region through said channel, and wherein said potentials are applied to said second back gate electrode and said second body electrode so as to induce a channel of n-type conductivity in said second portion contacting said insulating layer such that said channel contacts said second semiconductor region and so as to control electrons such that said electrons flow into said second semiconductor region through said channel.

24. A semiconductor device according to claim 23, wherein said potentials are applied to said first back gate electrode and said first body electrode to control holes such that said holes flow into said first semiconductor region, and wherein said potentials are applied to said second back gate electrode and said second body electrode to control electrons such that said electrons flow into said second semiconductor region.

25. A semiconductor device according to claim 23, wherein said potentials are applied to said first back gate electrode and said first body electrode to induce holes in a region of said first portion contacting said insulating layer, and wherein said potentials are applied to said second back gate electrode and said second body electrode to induce electrons in a region of said second semiconductor layer contacting said insulating layer.

* * * * *